(12) United States Patent
Yokoyama et al.

(10) Patent No.: US 6,608,383 B2
(45) Date of Patent: Aug. 19, 2003

(54) SEMICONDUCTOR DEVICE INCLUDING CAPACITOR WITH LOWER ELECTRODE INCLUDING IRIDIUM AND IRIDIUM OXIDE LAYERS

(75) Inventors: Seiichi Yokoyama, Kashiwa (JP); Shun Mitarai, Nishinomiya (JP); Masaya Nagata, Nara (JP); Jun Kudo, Nara (JP); Nobuhito Ogata, Tenri (JP); Yasuyuki Itoh, Hamamatsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/950,804

(22) Filed: Sep. 13, 2001

(65) Prior Publication Data

US 2002/0003247 A1 Jan. 10, 2002

Related U.S. Application Data

(62) Division of application No. 09/219,310, filed on Dec. 23, 1998, now Pat. No. 6,313,539.

(30) Foreign Application Priority Data

Dec. 24, 1997 (JP) .............................................. 9-354710
Feb. 18, 1998 (JP) ............................................ 10-035639

(51) Int. Cl.[7] .......................... H01L 23/48; H01L 23/52; H01L 29/40
(52) U.S. Cl. ........................ 257/761; 257/295; 257/296; 257/298; 257/300; 257/306; 257/307; 257/308; 257/552; 257/751
(58) Field of Search ................................ 257/298, 300, 257/306–309, 296, 761, 295, 751, 310, 552

(56) References Cited

U.S. PATENT DOCUMENTS 5,335,138 A  8/1994  Sandhu et al. .............. 361/303
5,554,866 A  9/1996  Nishioka et al. ............ 257/295

(List continued on next page.)

FOREIGN PATENT DOCUMENTS

JP  08-097382  4/1996

OTHER PUBLICATIONS

U.S. patent application Ser. No. 09/219,310, filed Dec. 23, 1998.

M. Nakabayashi et al, "Electrodes for Ferroelectric Materials"; The 43rd Spring Meeting of the Japanese Society of Applied Physics and the Related Societies, 28p–V–4, 1996, p. 499.

Primary Examiner—Amir Zarabian
Assistant Examiner—Ida M. Soward
(74) Attorney, Agent, or Firm—Nixon & Vanderhye P.C.

(57) ABSTRACT

A semiconductor memory device includes: a capacitor formed on a substrate and including a lower electrode, a dielectric film and an upper electrode; a selection transistor formed at the substrate; an electrically conductive plug for providing electrical connection between the selection transistor and the capacitor; and a diffusion barrier film provided between the electrically conductive plug and the lower electrode of the capacitor. The diffusion barrier film is a $Ta_xSi_{1-x}N_y$ film or a $Hf_xSi_{1-x}N_y$ film (where $0.2<x<1$ and $0<y<1$). The lower electrode includes an Ir film and an $IrO_2$ film which are sequentially formed.

7 Claims, 24 Drawing Sheets

U.S. PATENT DOCUMENTS

| | | | |
|---|---|---|---|
| 5,604,145 A | * | 2/1997 | Hashizume et al. ......... 438/240 |
| 5,717,236 A | * | 2/1998 | Shinkawata .................. 257/306 |
| 5,793,600 A | * | 8/1998 | Fukuda et al. ............ 361/321.4 |
| 5,834,357 A | * | 11/1998 | Kang ......................... 438/396 |
| 5,838,035 A | * | 11/1998 | Ramesh ...................... 257/295 |
| 5,854,104 A | * | 12/1998 | Onishi et al. ................ 438/240 |
| 5,858,851 A | * | 1/1999 | Yamagata et al. ........... 438/396 |
| 5,874,364 A | | 2/1999 | Nakabayashi et al. ...... 438/738 |
| 5,905,278 A | * | 5/1999 | Nakabayashi ............... 257/296 |
| 5,965,942 A | * | 10/1999 | Itoh et al. .................... 257/761 |
| 6,015,989 A | | 1/2000 | Horikawa et al. .......... 257/309 |
| 6,043,529 A | * | 3/2000 | Hartner et al. .............. 257/306 |
| 6,078,493 A | * | 6/2000 | Kang ......................... 361/303 |
| 6,239,460 B1 | | 5/2001 | Kuroiwa et al. ............. 257/300 |
| 6,278,150 B1 | * | 8/2001 | Okudaira et al. ............ 257/306 |
| 6,313,539 B1 | | 11/2001 | Yokoyama et al. |
| 2001/0012658 A1 | * | 8/2001 | Widmann et al. ........... 257/296 |

* cited by examiner

Ta composition x in $Ta_xSi_{(1-x)}N_y$ film

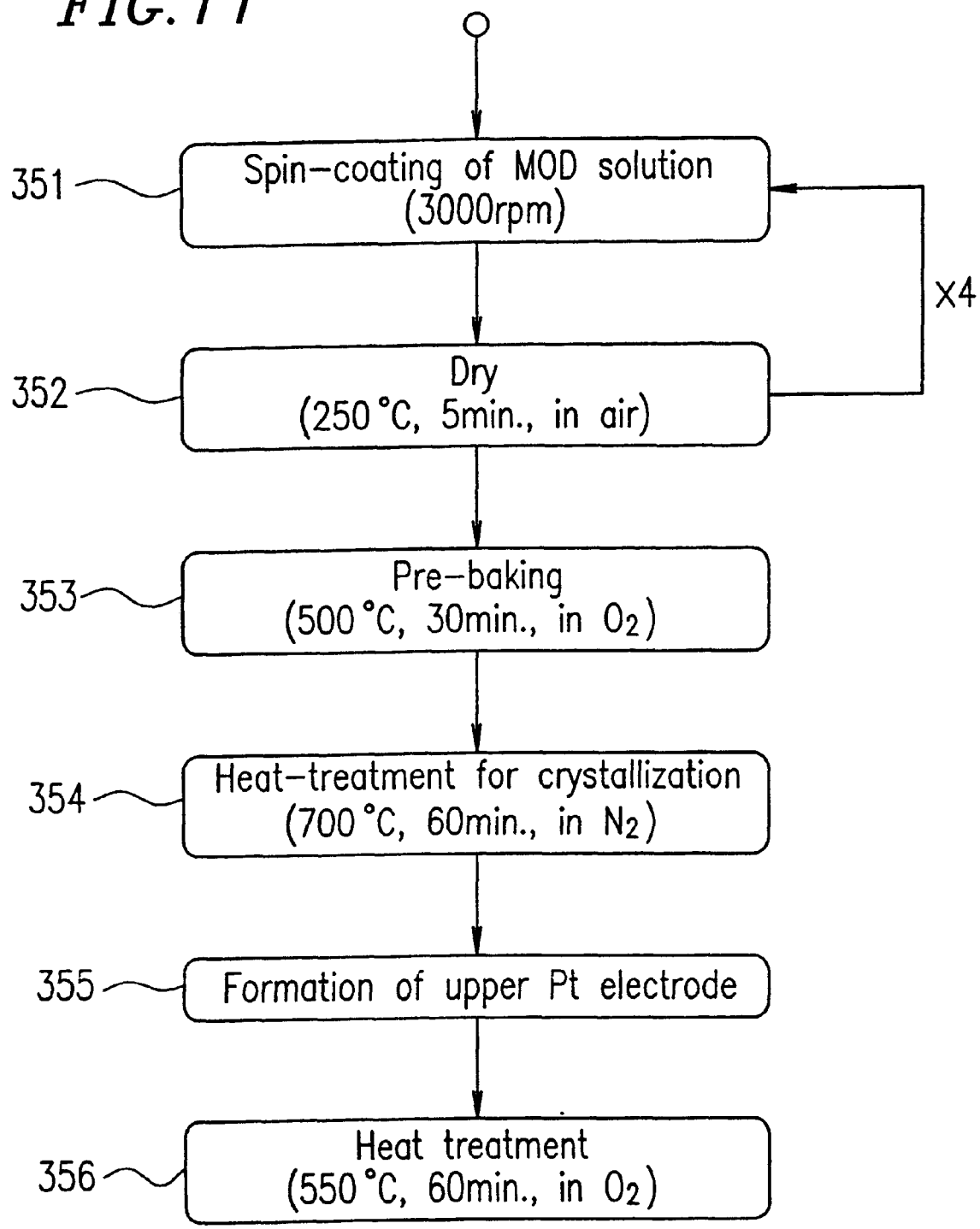

SEMICONDUCTOR DEVICE INCLUDING CAPACITOR WITH LOWER ELECTRODE INCLUDING IRIDIUM AND IRIDIUM OXIDE LAYERS

This application is a division of Ser. No. 09/219,310, filed Dec. 23, 1998, now U.S. Pat. No. 6,313,539, the entire disclosure of which is hereby incorporated by reference in this application.

BACKGROUND OF THE INVENTION

1. Field of the Invention

The present invention relates to a semiconductor memory device and a method for producing the same. In particular, the present invention relates to a semiconductor memory device incorporating a capacitor which includes a lower electrode, a dielectric film, and an upper electrode, the capacitor being electrically connected to a selection transistor via an electrically conductive plug and a diffusion barrier film, as well as a method for producing the same. The present invention further relates to a method for producing a capacitor for use in such a semiconductor memory device, the capacitor including a ferroelectric film (hereinafter, such a capacitor will also be referred to as a "ferroelectric capacitor"), as well as a method for producing a nonvolatile semiconductor memory device incorporating such a ferroelectric capacitor.

2. Description of the Related Art

Ferroelectric materials have a large range of applications for various devices utilizing their functions including spontaneous polarization, high dielectric constant, electro-optical effects, piezoelectric effects, pyroelectric effects, and the like. For example, the pyroelectric properties of ferroelectric materials are utilized in infrared linear array sensor applications; their piezoelectric properties are utilized in ultrasonic wave sensor applications; their electro-optical effects are utilized in waveguide type optical modulator applications; their high dielectric properties are utilized in capacitors for use in DRAMs (Dynamic Random Access Memories) and MMICs (Monolithic Microwave Integrated Circuits), and so on.

Above all, non-volatile memories (FRAMs: ferroelectric non-volatile memories), which incorporate a ferroelectric film and are capable of high-density implementation and high-speed operation, have been a subject of intensive development, in response to the recent development in thin film formation technologies in combination with semiconductor memory art. FRAMs provide advantages such as high-speed writing/reading, low voltage operation, and high endurance through repetitive writing/reading. Therefore, research and development efforts have been made to implement FRAMs which can replace not only conventional non-volatile memories but potentially SRAMs and/or DRAMs also.

Conventional non-volatile memories such as EPROMs, EEPROMs, and flash memories require a read time which is equivalent to that required for a DRAM. However, they require a long write time, thereby hindering high-speed operation. On the other hand, FRAMs are capable of both reading and writing at a rate which is equivalent to that of DRAMs. Thus, high-speed operation is expected of FRAMs. In a typical device structure of an FRAM, one cell is constructed from one selection transistor and one ferroelectric capacitor; alternatively, one cell is constructed from two selection transistors and two ferroelectric capacitors.

Conventionally, oxide ferroelectric materials (PZT (lead zirconate titanate), $SrBi_2Ta_2O_9$, $Bi_4Ti_3O_{12}$, etc.) have been studied as ferroelectric materials for use in a ferroelectric capacitor. As a lower electrode of such a ferroelectric capacitor, electrodes formed of a precious metal material (e.g., Pt, Pt/Ta, Pt/Ti) or composite electrodes formed of precious metal material(s) and a closely contacting film have been used for improved characteristics of the resultant thin ferroelectric film.

A ferroelectric film must be in the form of a crystallized film in order for its functions to be fully utilized. Therefore, a high-temperature heat treatment at about 600° C. to about 800° C. in an oxygen atmosphere is required as a crystallization process.

Furthermore, it is generally considered essential to employ a stacked structure in order to achieve a high density integration, e.g., 4 Mbits or above, by utilizing such a ferroelectric capacitor and manufacturing processes thereof. This in turn requires a structure in which a selection transistor is electrically coupled to a ferroelectric capacitor via an electrically conductive plug, e.g., polysilicon. In the case of a Pt/polysilicon structure, a diffusion barrier film (e.g., TiN) is required so as to prevent silicidation of a Pt lower electrode which may occur during a crystallization process of the ferroelectric material.

However, although a Pt film itself has sufficient anti-oxidation properties, the TiN layer in a Pt/TiN/Ti structure may be oxidized by oxygen gas which has moved along grain boundaries in the Pt film during the crystallization process of the ferroelectric material, as reported in the Extended Abstracts of the 43rd Spring Meeting (1996) of the Japanese Society of Applied Physics and the related Societies, 28p-V-6 (p. 500). Furthermore, as reported in the above publication as the article 28p-V-7, oxidation of TiN, if it occurs, may cause peeling at the Pt/TiN interface or hillocks in an upward direction within the Pt film so as to alleviate any variation in stress due to volume expansion resulting from the oxidation of TiN. This presents a considerable problem.

The aforementioned movement of oxide through the Pt film presents another problem in that, in the case where a closely contacting film is employed in a Pt/Ta/TiN/Ti structure or a Pt/Ti/TiN/Ti structure, an insulating material may be formed as a result of oxidation of the Ta or Ti immediately underlying the Pt, thereby disrupting the electrical connection. The lowermost Ti film is a requirement in these multi-layer structures to establish contact between the respective structure and polysilicon.

Thus, constructing an electrode only from a Pt film, or a combination of a Pt film and a closely contacting film can result in marked problems associated with hillocks and/or insufficient electrical contact due to the oxidation of a diffusion barrier film such as TiN. These problems make it difficult to realize stacked type structures.

On the other hand, the use of an oxide electrode material (e.g., $IrO_2$, $RuO_2$, $RhO_2$, $OSO_2$, and $ReO_2$) for a lower electrode under the aforementioned oxide ferroelectric film has begun to be studied because they provide excellent barrier properties and excellent matching with an overlying oxide dielectric material.

Among others, the use of $IrO_2$ can greatly improve the fatigue characteristics of a layer of PZT formed upon an $Ir/IrO_2$/polysilicon electrode or a $Pt/IrO_2$/polysilicon electrode, as reported in Appl. Phys. Lett., vol. 65 (1994), pp. 1522–1524 and Jpn. J. Appl. Phys., vol. 33 (1994), pp. 5207–5210, which ascribes such improvement to the barrier properties of the $IrO_2$ film against the elements (e.g., Pb) composing the ferroelectric film. However, again such a structure is susceptible to the problem of insufficient electrical contact due to oxidation of the polysilicon at the $IrO_2$/polysilicon interface, as well as silicidation of $IrO_2$ formed immediately above the polysilicon, during the $IrO_2$ film formation and the ferroelectric film formation.

An $IrO_2$(1000 Å)/Ir(500 Å)/TiN/Ti lower electrode, incorporating a TiN film as a barrier metal for an oxide electrode ($IrO_2$ electrode), has been reported in the Extended Abstracts of the 43rd Spring Meeting (1996) of the Japanese Society of Applied Physics and the related Societies, 28p-V-4 (p. 499) for solving the problem associated with the reaction between Ir or $IrO_2$ and polysilicon. In this reference, contact characteristics between a silicon substrate having a reduced resistance due to ion implantation and a $SrTiO_3$ film serving as a high dielectric film was examined. As a result, it was confirmed that ohmic contact is established therebetween. More specifically, a leakage current density of about $10^{-7}$ $A/cm^2$ and a dielectric constant of about 216 are reported to be obtained, both of these values being substantially equal to those obtainable for the Pt electrode. Such an $IrO_2$/Ir/TiN/Ti structure prevents any degradation in electric characteristics of the capacitor which is associated with hillocks and reduced flatness typically caused in the relatively low-temperature process of about 200° C. to about 450° C. to be performed for forming a $SrTiO_3$ film as a high dielectric material film. Thus, the $IrO_2$/Ir/TiN/Ti structure was confirmed to be a promising candidate for use in the stacked type structure incorporating a high dielectric capacitor.

However, the ferroelectric material crystallization process requires the use of an oxygen atmosphere at a temperature of about 600° C. or higher even for forming a PZT film. Moreover, an oxygen atmosphere at about 800° C. or higher is often used for a $SrBi_2Ta_2O_9$ film. In the Pt/TiN/Ti structure, an insulating material may be formed at such a high temperature as a result of oxidation of the Ti which is a closely contacting film, thereby disrupting the electrical conduction. In addition, hillocks may be produced by the film stress due to oxidation of TiN. In the $IrO_2$/Ir/TiN/Ti structure as well, hillocks may be produced by the film stress due to the crystallization process at a high temperature (i.e., > about 600° C.).

In view of the aforementioned problems, Ir and $IrO_2$ having excellent crystallinity are required to obtain improved anti-oxidation properties. However, when the $IrO_2$ film is formed directly on the Ir film at a high temperature, the $IrO_2$ film becomes non-uniform in quality, making it impossible to form a homogenous film at a high temperature. Moreover, hillocks or the like may be produced in a high-temperature atmosphere due to the poor anti-heat properties of the diffusion barrier film.

Thus, in order to practically produce the memories incorporating a ferroelectric film or high dielectric film in the stacked type structure, it is desirable to implement a lower electrode structure exhibiting no reaction with ferroelectric materials to be provided thereon and having anti-heat properties in an oxidation atmosphere at about 600° C. or higher; a flat, dense profile; and a resistivity which is equivalent to or better than that of the conventional Pt electrode.

$SrBi_2Ta_2O_9$ has been actively studied as a promising candidate of a ferroelectric material for use in the ferroelectric capacitor, because it has better fatigue characteristics and requires lower driving voltage as compared to the conventionally used PZT. Unlike the conventional ferroelectric materials such as PZT, $SrBi_2Ta_2O_9$ is crystallized through heat-treatment in a high-temperature oxidizing atmosphere of about 700° C. to about 800° C. in any of the formation methods including an MOD (Metal Organic Decomposition) method, a sol-gel method, an MOCVD (Metal Organic Chemical Vapor Deposition) method and a sputtering method, as disclosed in Japanese Laid-Open Publication Nos. 8-23073 and 9-36309.

It should be noted that such heat-treatment in the high-temperature oxidizing atmosphere does not cause a serious problem in the case of a relatively poorly integrated ferroelectric capacitor with a flat structure. However, in the stacked type structure which is essential to achieve a high-density integration of the ferroelectric memories, a polysilicon plug typically used to establish contact with a lower electrode and/or a diffusion barrier layer (barrier metal layer), e.g., TiN or TaSiN, for preventing diffusion between the plug and the lower platinum electrode, tend to be oxidized during the high-temperature process. Such oxidation of the polysilicon plug and/or diffusion barrier layer (barrier metal layer), if it occurs, may disrupt electrical conduction between the plug and the lower electrode, and/or may cause peeling due to expansion of the barrier metal.

SUMMARY OF THE INVENTION

A semiconductor memory device of the present invention includes: a capacitor formed on a substrate and including a lower electrode, a dielectric film and an upper electrode; a selection transistor formed at the substrate; an electrically conductive plug for providing electrical connection between the selection transistor and the capacitor; and a diffusion barrier film provided between the electrically conductive plug and the lower electrode of the capacitor. The diffusion barrier film is a $Ta_xSi_{1-x}N_y$ film or a $Hf_xSi_{1-x}N_y$ film (where $0.2<x<1$ and $0<y<1$), and the lower electrode includes an Ir film and an $IrO_2$ film which are sequentially formed.

The lower electrode may further include an electrically conductive film formed on the $IrO_2$ film, the electrically conductive film containing at least one of metal elements selected from the group consisting of Pt, Ir, Ru, Rh, Os and Re.

The diffusion barrier film may be a $Ta_xSi_{1-x}N_y$ film or a $Hf_xSi_{1-x}N_y$ film (where $0.75<x<0.95$ and $0.3<y<0.5$).

A ratio of a thickness d1 of the $IrO_2$ film to a thickness d2 of the Ir film may satisfy a relation of $1 \leq d1/d2 \leq 3$.

Another aspect of the present invention provides a method for producing a semiconductor memory device including a capacitor which includes a lower electrode, a dielectric electrode and an upper electrode. The capacitor is electrically connected to a selection transistor via an electrically conductive plug and a diffusion barrier film. The method includes the steps of: forming the diffusion barrier film at a prescribed position on a substrate; forming an Ir film on the diffusion barrier film; forming an initial film with a thickness of about 50 Å to about 300 Å on the Ir film at a temperature of about 300° C. to about 400° C., the initial film containing at least one of metal elements selected from the group consisting of Ir, Ru, Rh, Os and Re; forming an $IrO_2$ film on the initial film to obtain a layered structure of the lower electrode; forming the dielectric film on the lower electrode; and forming the upper electrode on the dielectric film.

The method may further include the step of forming an electrically conductive film on the $IrO_2$ film. The electrically conductive film contains at least one of metal elements selected from the group consisting of Pt, Ir, Ru, Rh, Os and Re.

The $IrO_2$ film may be formed at a temperature of about 450° C. to about 700° C.

A ratio of a thickness d1 of the $IrO_2$ film to a thickness d2 of the Ir film may satisfy a relation of $1<d1/d2<3$.

The initial film may be formed as an $IrO_2$ film.

The diffusion barrier film may be formed as a $Ta_xSi_{1-x}N_y$ film or a $Hf_xSi_{1-x}N_y$ film (where $0.2<x<1$ and $0<y<1$). Preferably, the diffusion barrier film is formed as a $Ta_xSi_{1-x}N_y$ film or a $Hf_xSi_{1-x}N_y$ film (where $0.75<x<0.95$ and $0.3<y<0.5$).

Still another aspect of the present invention provides a method for producing a semiconductor memory device including a capacitor which includes a lower electrode, a dielectric film and an upper electrode, in which the capacitor is electrically connected to a selection transistor via an electrically conductive plug and a diffusion barrier film. The method includes the steps of: forming the diffusion barrier film at a prescribed position on a substrate; forming an Ir film on the diffusion barrier film; forming the dielectric film on the Ir film using a material which contains oxygen; and forming the upper electrode on the dielectric film.

The diffusion barrier film may be formed as a $Ta_xSi_{1-x}N_y$ film or a $Hf_xSi_{1-x}N_y$ film (where $0.2<x<1$ and $0<y<1$). Preferably, the diffusion barrier film is formed as a $Ta_xSi_{1-x}N_y$ film or a $Hf_xSi_{1-x}N_y$ film (where $0.75<x<0.95$ and $0.3<y<0.5$).

In the aforementioned production method of the present invention, the dielectric film may be a ferroelectric film, and the step of forming the ferroelectric film may include the step of crystallizing the ferroelectric film by conducting heat-treatment in an inert gas atmosphere.

In such a case, the method may further include the step of conducting heat-treatment for supplementing oxygen loss of the ferroelectric film, after the step of crystallizing the ferroelectric film, wherein the heat-treatment is conducted in an oxygen atmosphere at such a temperature that prevents an underlying layer of the lower electrode from being oxidized. The heat-treatment for supplementing the oxygen loss may be conducted after the formation of the upper electrode.

The step of forming the ferroelectric film may include the steps of: applying a constituent material of the ferroelectric film to a prescribed thickness by a film application method; drying the applied constituent material; and repeating the applying step and the drying step a prescribed number of times to form the ferroelectric film having a desired thickness.

Alternatively, the step of forming the ferroelectric film may include the steps of: forming a film of a constituent material of the ferroelectric film to a prescribed thickness; crystallizing the film of the constituent material by conducting heat-treatment in an inert gas atmosphere; and repeating the film forming step and the crystallizing step a prescribed number of times to form the ferroelectric film having a desired thickness. The film of the constituent material of the ferroelectric film may be formed by a film application method.

The ferroelectric film may be formed from a Bismuth-layer-structured-family compound. For example, the Bismuth-layer-structured-family compound may be $SrBi_2(Ta_{1-x}Nb_x)_2O_9$ (where $0<x<1$).

The heat-treatment for crystallizing the ferroelectric film may be conducted at a temperature of about 650° C. to about 800° C.

The method may further include the steps of: forming the selection transistor at the substrate; forming an interlayer insulation film on the selection transistor; and forming a contact hole in the interlayer insulation film and forming an electrically conductive plug in the contact hole, wherein the diffusion barrier film is formed on the electrically conductive plug in the semiconductor substrate so as to be electrically connected to the electrically conductive plug.

Thus, the invention described herein makes possible the advantages of (1) providing a semiconductor memory device incorporating a ferroelectric capacitor which exhibits excellent ferroelectric characteristics, and (2) providing a method for producing such a semiconductor memory device with high yield.

These and other advantages of the present invention will become apparent to those skilled in the art upon reading and understanding the following detailed description with reference to the accompanying figures.

BRIEF DESCRIPTION OF THE DRAWINGS

FIG. 11 is a flow chart illustrating a process for producing a ferroelectric capacitor according to Example 3 of the present invention;

DESCRIPTION OF THE PREFERRED EMBODIMENTS

EXAMPLE 1

Figure 1:
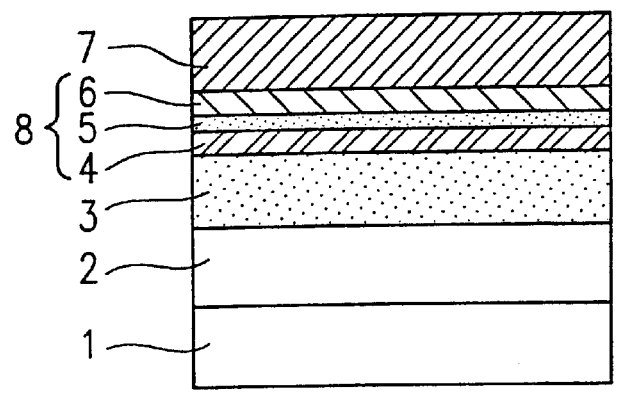
FIG. 1 is a cross sectional view schematically showing a structure of a ferroelectric capacitor including a ferroelectric film formed on a lower electrode, according to Example 1 of the present invention.
Figure 2:
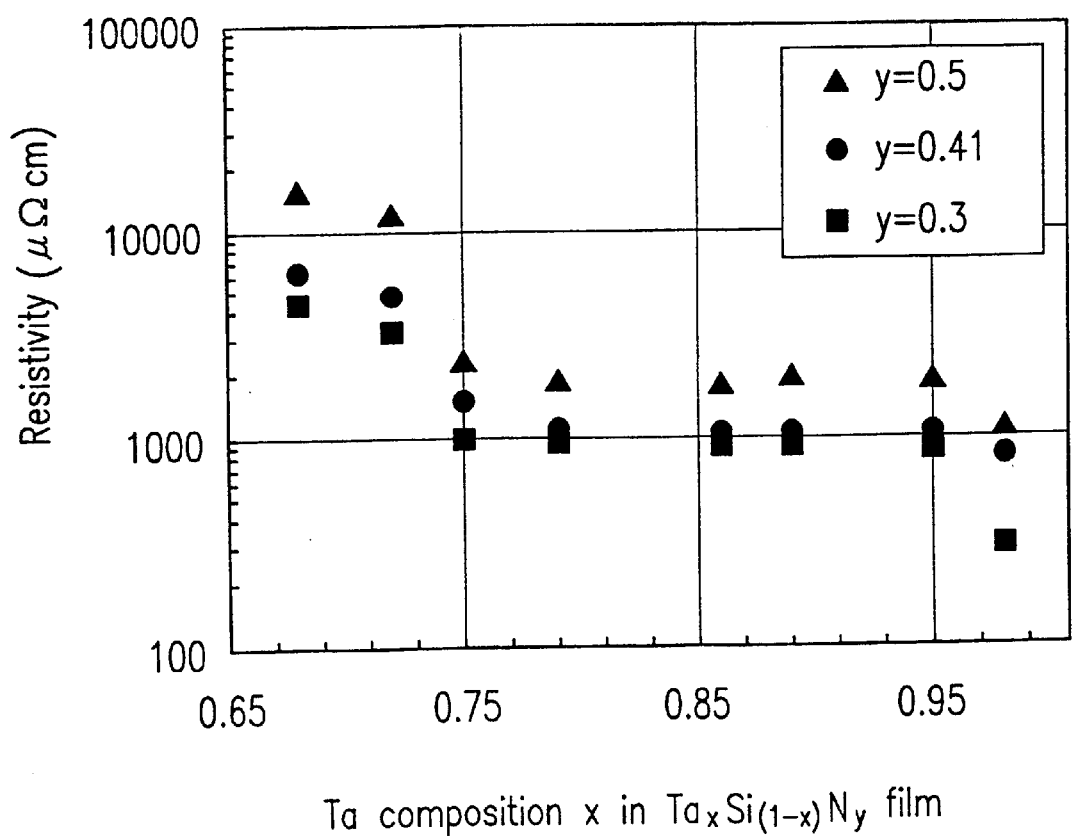
FIG. 2 is a diagram showing a variation in resistivity with different Ta compositions x in a $Ta_xSi_{(1-x)}N_y$ film which is included in the structure of the ferroelectric capacitor of FIG. 1.
Figure 3A:
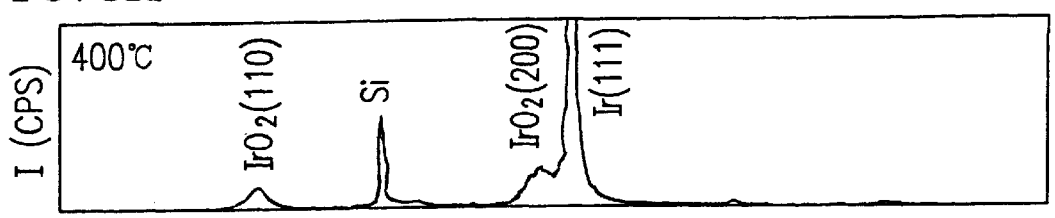
FIGS. 3A to 3C are diagrams showing XRD chart characteristics of an $IrO_2$ film respectively formed at different temperatures.
Figure 3B:
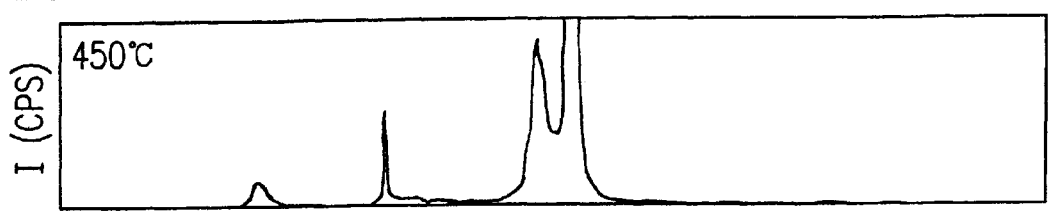
Figure 3C:
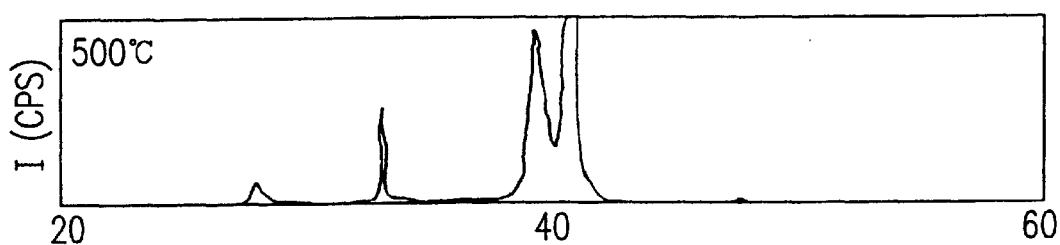
Figure 4:
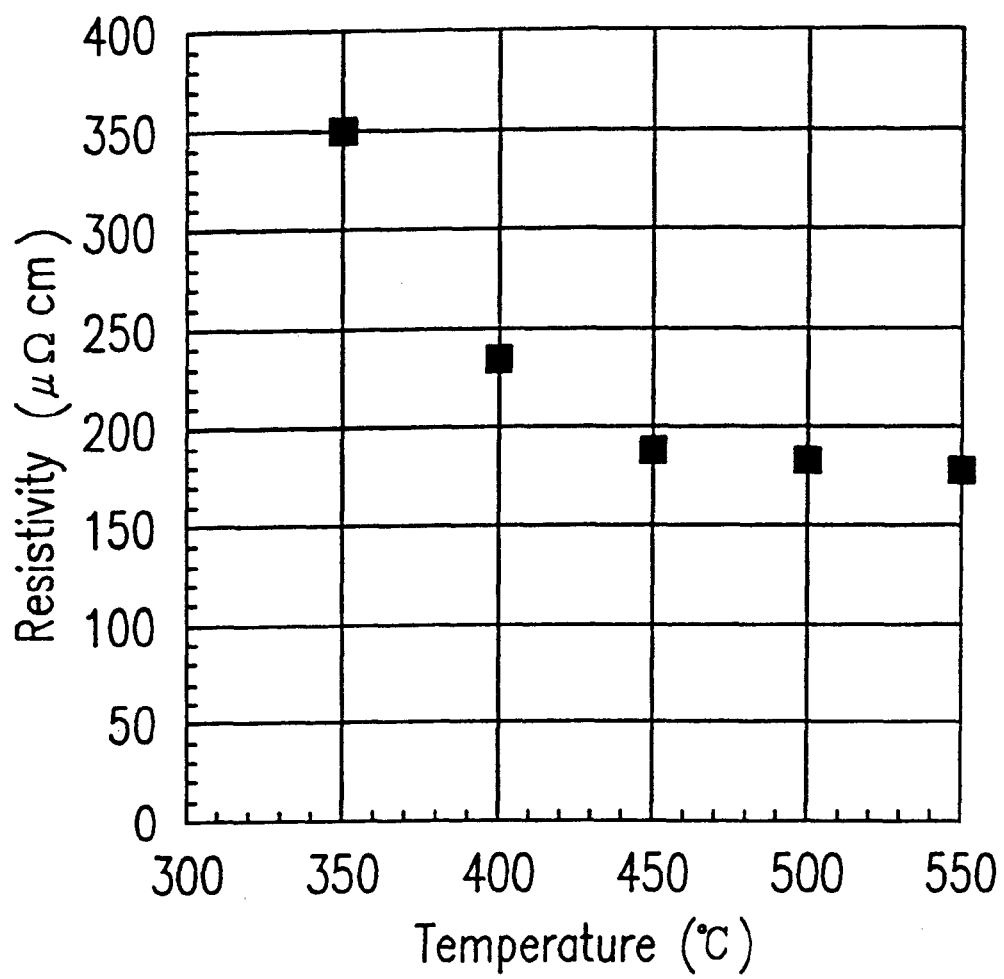
FIG. 4 is a diagram showing a variation in resistivity of the $IrO_2$ film formed at different temperatures.

FIG. 1 is a cross sectional view schematically showing a structure of a ferroelectric capacitor including a ferroelectric film formed on a lower electrode, according to Example 1 of the present invention. FIG. 2 is a diagram showing a variation in resistivity with different Ta compositions x in a $Ta_xSi_{(1-x)}N_y$ film (hereinafter, also referred to as a TaSiN film) which is included in the structure of the ferroelectric capacitor of FIG. 1; FIGS. 3A to 3C are diagrams showing XRD chart characteristics of an $IrO_2$ film respectively formed at different temperatures; and FIG. 4 is a diagram showing a variation in resistivity of the $IrO_2$ film formed at different temperatures. Furthermore, FIG. 5 is a cross sectional view showing a structure of a semiconductor memory device of the present invention which incorporates the ferroelectric capacitor of FIG. 1, and FIG. 6 is a diagram showing a hysteresis loop obtained by the semiconductor memory device of FIG. 5.

Figure 5:
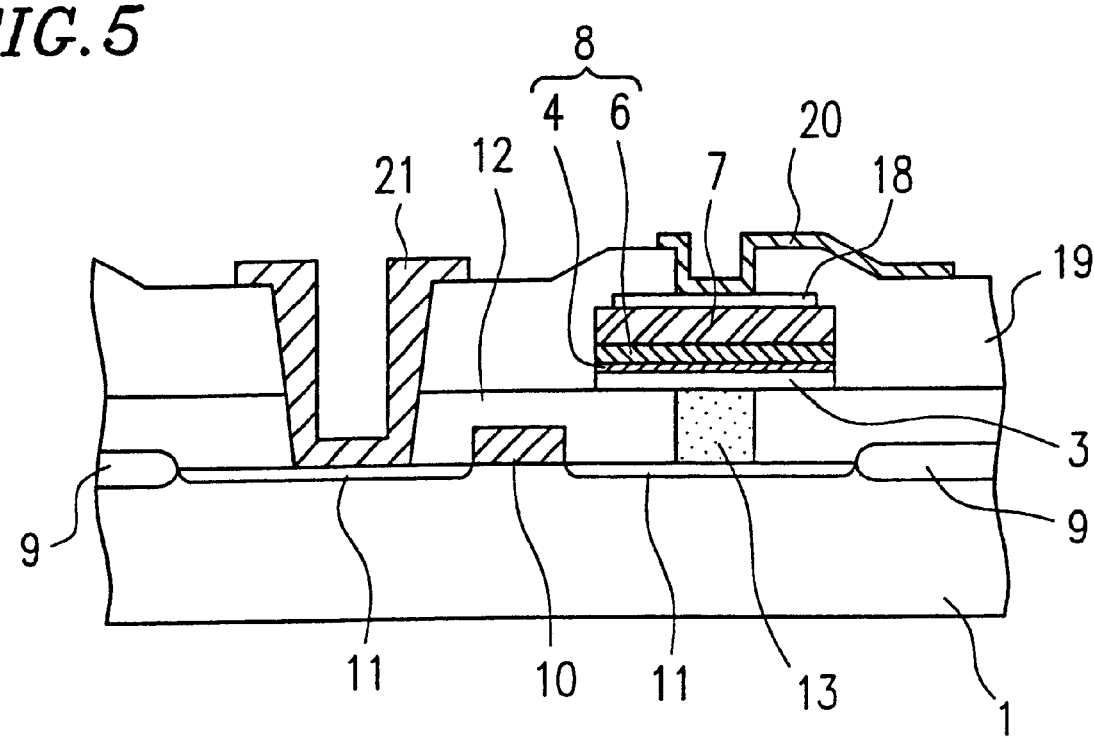
FIG. 5 is a cross sectional view showing a structure of a semiconductor memory device of the present invention which incorporates the ferroelectric capacitor of FIG. 1.
Figure 6:
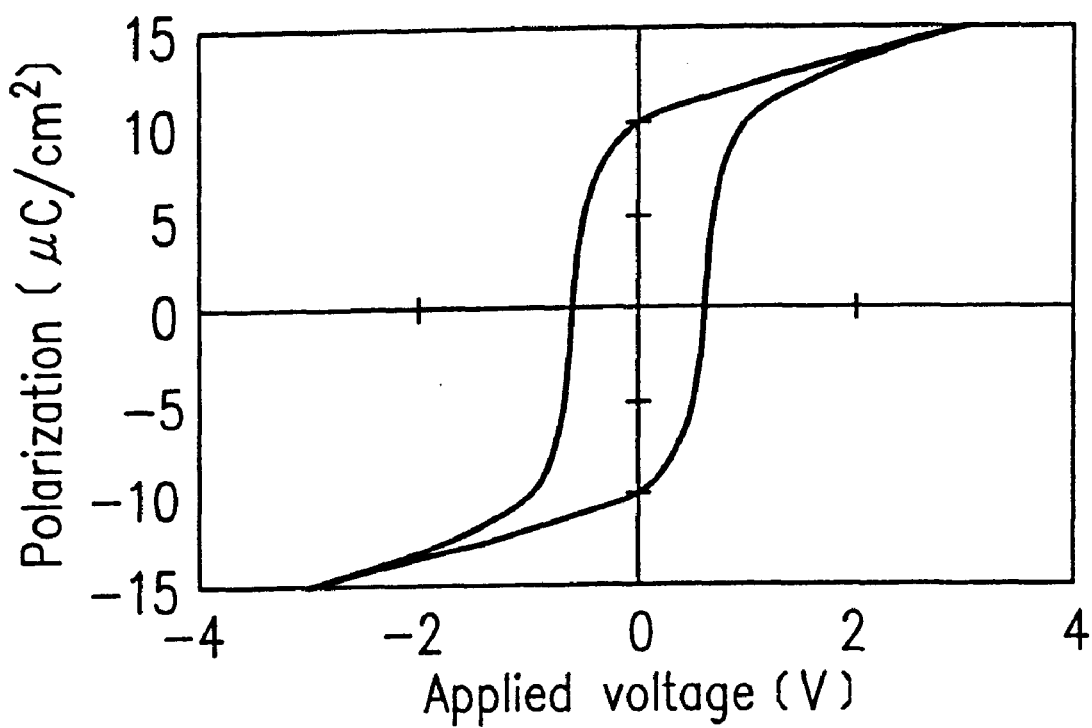
FIG. 6 is a diagram showing a hysteresis loop obtained by the semiconductor memory device of FIG. 5.
Figure 7:
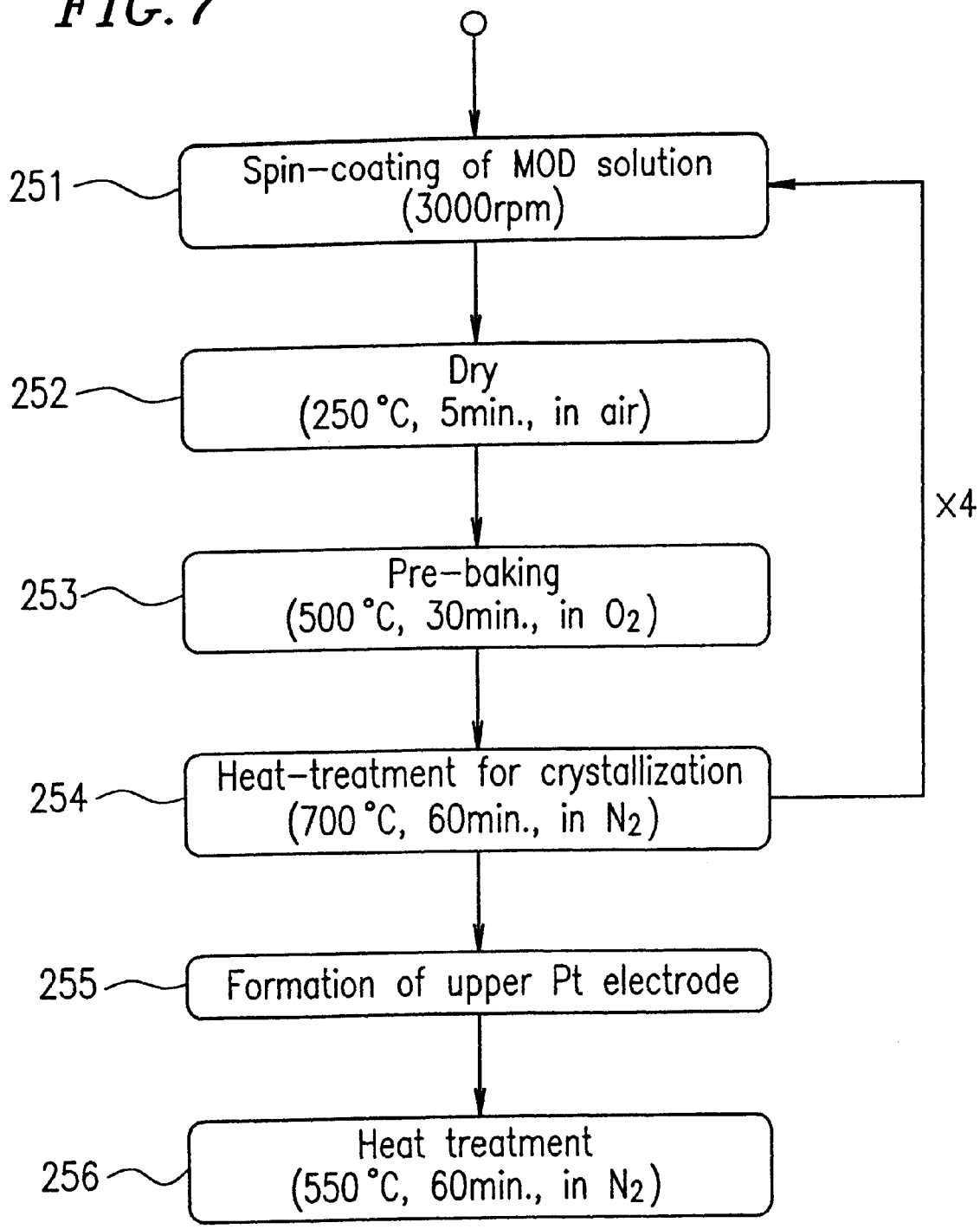
FIG. 7 is a flow chart illustrating a process for producing a ferroelectric capacitor according to Example 2 of the present invention.

In FIGS. 1 and 5, reference numeral 1 denotes a silicon substrate; 2 denotes a thermal oxide film; 3 denotes a TaSiN film; 4 denotes an Ir film; 5 denotes an initial film; 6 denotes an $IrO_2$ film; 7 denotes a ferroelectric film; 8 denotes a lower electrode; 9 denotes a LOCOS (LOCal Oxidation of Silicon) oxide film; 10 denotes a gate electrode; 11 denotes source/drain regions; 12 denotes a first silicon oxide film; 13 denotes a polysilicon plug; 18 denotes an upper electrode; 19 denotes a second silicon oxide film; 20 denotes a first aluminum extended electrode; and 21 denotes a second aluminum extended electrode.

The substrate 1 used in the semiconductor memory device incorporating the ferroelectric capacitor according to the present invention is not limited to a specific material, as long as the substrate 1 can be used for normal semiconductor devices, integrated circuits or the like. For example, the substrate may be selected from a semiconductor substrate (e.g., silicon), a compound semiconductor substrate (e.g., GaAs), an oxide crystalline substrate (e.g., MgO) or a glass substrate, according to the types, applications or the like of the device to be formed. However, a silicon substrate is preferable.

In the structure of FIG. 1, the lower electrode 8 is formed on such a substrate 1. The lower electrode 8 represents a part of a semiconductor memory device to be formed, that is, an electrode to be utilized as a capacitance material of the capacitor. The lower electrode 8 is usually formed on the substrate 1. However, components such as an insulation film, lower layer interconnection, a desired element and an interlayer insulation film may be provided alone or in combination on the substrate 1, so that the lower electrode 8 may be formed thereover.

Each of the films included in the structure of FIG. 1 is formed by, for example, a sputtering method. By inserting the initial film 5 between the $IrO_2$ film 6 and the Ir film 4, non-uniformity in quality (more specifically, crystallinity) of the $IrO_2$ film 6 can be prevented from being generated during its formation at a high temperature. The initial film 5 may be a thin film containing at least one of Ir, Ru, Rh, Os and Re. This allows for high-temperature formation of the films, thereby improving the crystallinity of the electrode material. As a result, the electrode structure having both excellent anti-oxidation properties and excellent anti-heat properties is provided. Moreover, by optimizing the composition of the TaSiN film 3 to be combined with the lower electrode 8, the electrode structure having improved characteristics of resistance to a high-temperature oxygen atmosphere can be implemented.

According to the conventional production method, an electrode having an $Ir/IrO_2/Ir/Ti$ structure is formed by heat-treatment at about 600° C. for about 60 minutes in a diffusion furnace. During this heat-treatment, Ti is oxidized, thereby disrupting electrical conduction with underlying silicon. According to the present invention, however, the TaSiN film 3 serving as a diffusion barrier film is not oxidized even during the heat-treatment at about 700° C. for about 60 minutes. Therefore, the oxide electrode, having anti-heat properties as well as anti-oxidation properties at a temperature higher by at least 100° C. as compared with the conventional production method, can be realized.

The ferroelectric capacitor includes the electrode structure of the present invention as the lower electrode 8, and the ferroelectric film 7 formed thereon. The ferroelectric film 7 may be formed from a material such as an oxide ferroelectric material (e.g., PZT, $SrBi_2Ta_2O_9$ or $Bi_4Ti_3O_{12}$). The ferroelectric film 7 is not limited to a specific material as long as the ferroelectric film 7 is a Bi-type ferroelectric material having a laminar perovskite structure. However, the ferroelectric film 7 is preferably a ferroelectric material represented as $Bi_2A_{m-1}B_mO_{3m+3}$ (where A is Na, K, Pb, Ca, Sr, Ba or Bi; and B is Fe, Ti, Nb, Ta, W or Mo), and more preferably, m is a natural number. More specifically, the ferroelectric film 7 may be $Bi_4Ti_3O_{12}$, $SrBi_2Ta_2O_9$, $SrBi_2Nb_2O_9$, $BaBi_2Nb_2O_9$, $BaBi_2Ta_2O_9$, $PbBi_2Nb_2O_9$, $PbBi_2Ta_2O_9$, $PbBi_4Ti_4O_{15}$, $SrBi_4Ti_4O_{15}$, $BaBi_4Ti_4O_{15}$, $Sr_2Bi_4Ti_5O_{18}$, $Ba_2Bi_4Ti_5O_{18}$, $Pb_2Bi_4Ti_5O_{18}$, $Na_{0.5}Bi_{4.5}Ti_4O_{15}$, $K_{0.5}Bi_{4.5}Ti_4O_{15}$, $Sr_2Bi_4Ti_4O_{18}$, $Ba_2Bi_4Ti_5O_{18}$, $Pb_2Bi_4Ti_5O_{18}$ or the like, wherein $SrBi_2Ta_2O_9$ is preferable.

Such a ferroelectric film 7 is formed by the methods such as a spin-on method, a reactive deposition method, an EB (electron beam) deposition method, a sputtering method and a laser ablation method. For example, according to the spin-on method, constituent elements of the above-mentioned thin film are partially or entirely dispersed in a solvent and applied onto the substrate by a spin coating method. Then, the applied dispersion is dried, and a carbon component present in the resultant film is baked by sintering (pre-baking). Thereafter, the resultant material is baked in a gaseous phase containing oxygen or oxygen compound to obtain a crystal having a perovskite structure, whereby the ferroelectric film 7 is finally obtained.

The upper electrode 18 (see FIG. 5) is formed on the ferroelectric film 7. The upper electrode 18 may either have a single-layer structure of, for example, a Pt film, or a multi-layer structure formed by using the same materials and the same method as those of the lower electrode 8. The ferroelectric capacitor is completed by forming interconnection, an insulation film and the like each having a desired shape on the upper electrode 18.

The semiconductor memory device of the present invention including the ferroelectric film 7 can be mounted on an integrated circuit wafer, thereby constituting an integrated circuit. In this case, the ferromagnetic element is utilized as a ferroelectric capacitor; alternatively, the ferroelectric element may be utilized as a ferroelectric device or a part of the semiconductor device. For example, when the ferroelectric element is applied as a capacitance portion of a non-volatile memory or as the gate electrode of the FET and further combined with a gate insulating film, source/drain regions and the like, the semiconductor memory device of the present invention can be used as MFMIS-FET, MFS-FET or the like.

Hereinafter, the production process of the semiconductor memory device of the present invention will be described particularly with respect to the steps of producing the diffusion barrier film 3, the lower electrode 8 and the ferroelectric film 7 of the capacitor portion.

Referring to FIG. 1, the thermal oxide film 2 with a thickness of about 6000 Å is first formed on a surface of the silicon substrate 1. Then, the amorphous TaSiN film 3 serving as a diffusion barrier film is formed thereon with a thickness of about 1000 Å by a DC magnetron sputtering method. Thereafter, the resultant substrate is heat-treated in a nitrogen atmosphere so as to stabilize the TaSiN film 3. This heat-treatment may be omitted depending upon the conditions for forming the TaSiN film 3.

The composition of the TaSiN film 3 thus formed is desirably $Ta_xSi_{1-x}N_y$ (where $0.2<x<1$ and $0<y<1$), and more desirably, $0.75<x<0.95$ and $0.3<y0.5$.

As shown in FIG. 2, even if the nitrogen composition y of the TaSiN film 3 is varied (for example, even when y=0.5, 0.41 and 0.3), the resistivity of the TaSiN diffusion barrier film 3 can be suppressed to about 1000 $\mu\Omega$cm to about 2000 $\mu\Omega$cm when the Ta composition x is in the range of 0.75 to 0.95. Moreover, from an Auger electron spectroscopy, it has been confirmed that by setting the composition of the TaSiN diffusion barrier film 3 to the above-mentioned range, the reaction between the polysilicon plug 13 (see FIG. 5) provided for establishing electrical connection with the substrate 1 and the constituent components of the thin film formed on the TaSiN film 3 can be sufficiently suppressed. However, for $0.5<y$ or $y<0.3$, the TaSiN film 3 does not have sufficient barrier properties even when $0.75<x<0.95$. In this case, the reaction between the underlying polysilicon plug 13 and the overlying thin film easily occurs at the sintering temperature of about 600° C. or less. Therefore, $0.5<y$ and $y<0.3$ are not appropriate.

The amorphous TaSiN film 3 of Example 1 is formed by using an alloy target of Ta/Si=10/3 at a substrate temperature of about 500° C.; a sputtering power of about 2000 W; a sputtering gas pressure of about 0.7 Pa; and a flow rate ratio of sputtering gases (i.e., an Ar flow rate/a $N_2$ flow rate) of 3/2. Moreover, the amorphous TaSiN film 3 of Example 1 is subjected to a heat-treatment at about 600° C. for about one hour in a pure nitrogen atmosphere with a temperature rising rate of about 5° C./min. The TaSiN film 3 formed under the aforementioned conditions was confirmed to have an amorphous structure by X-ray diffraction spectroscopy, and to have a composition of $Ta_{0.85}Si_{0.15}N_{0.4}$ according to the analysis by the Auger electron spectroscopy.

Thereafter, the lower electrode 8 is formed on the TaSiN film 3 by the DC magnetron sputtering method. The lower electrode 8 has an $IrO_2/Ir$ structure, wherein the Ir film 4 and the $IrO_2$ film 6 are sequentially formed in this order.

More specifically, the Ir film 4 having a thickness of about 1000 Å is first formed at a DC power of about 0.5 kW; a substrate temperature of about 500° C.; and a gas pressure of about 0.6 Pa. Only Ar gas is used as a sputtering gas. The Ir film 4 thus formed exhibits a dense, flat surface profile, regardless of the high temperature of about 500° C. This is because, by reducing the sputtering power, and hence, the sputtering rate, rapid grain growth is suppressed so that the flat film surface can be maintained. The surface profile of the electrode structure is observed by a SEM (Scanning Electron Microscope).

Thereafter, the initial film 5 for forming the $IrO_2$ film 6 at about 500° C. is formed on the Ir film 4. The initial film 5 is formed with a thickness of about 200 Å at a DC power of about 1 kW; a substrate temperature of about 350° C.; and a gas pressure of about 0.71 Pa. A flow rate ratio of sputtering gases (i.e., an Ar flow rate/an $O_2$ flow rate) is ⅑. Thus, the $IrO_2$ film 5 is formed as the initial film 5 by a reactive sputtering method using an Ir target.

The reason why the initial film 5 is formed at about 350° C. is as follows: the film is not uniformly formed on a metal such as the Ir film 4 when the film formation temperature is higher than about 400° C., while the film exhibits non-uniform crystallinity by the subsequent film formation at a high temperature when the film formation temperature is less than about 300° C.

Although the initial film 5 is shown to have a thickness of about 200 Å, the initial film 5 may have any thickness of about 300 Å or less as long as a uniform film is obtained. However, the initial film 5 must have a thickness of at least 50 Å. The initial film 5 with a thickness larger than about 300 Å would have a locally non-uniform anti-oxidation properties due to the non-uniform crystallinity resulting from the high-temperature process. As a result, hillocks are locally produced in the initial film 5.

It should be noted that when a film is formed by the sputtering method, only an island-like film can be obtained if the thickness thereof is about 100 Å or less. Thus, a uniform $IrO_2$ film having any thickness can be formed on the surface of the Ir film 4 by exposure to oxygen plasma or ozone radiation onto the substrate surface. Therefore, when the initial film 5 having a thickness of about 100 Å or less is required, the $IrO_2$ film thus formed by the plasma exposure or the ozone radiation can be used as the initial film 5.

Although the initial film 5 is shown to be the $IrO_2$ film, the initial film 5 may be any film containing at least one of the metal elements selected from the group consisting of Ir, Ru, Rh, Os and Re. However, in terms of improvement in the film characteristics as well as simplification of the process, it is desirable to form the initial film 5 from $IrO_2$ using a target of the same material as that used in the subsequent formation of the $IrO_2$ film 6.

Thereafter, the IrO$_2$ film 6 having a thickness of about 1300 Å is formed on the initial film 5 at a DC power of about 1 kW; a gas pressure of about 0.71 Pa; a flow rate ratio of sputtering gases (i.e., an Ar flow rate/an O$_2$ flow rate) of 1/9; and a temperature of about 500° C.

From the comparison between the XRD chart of the IrO$_2$ film 6 formed at about 400° C. (FIG. 3A) and the XRD charts of the IrO$_2$ film 6 formed at about 450° C. or higher (FIGS. 3B and 3C), it is apparent that the peak intensity of IrO$_2$ (200) of the IrO$_2$ film 6 formed at about 450° C. or higher is at least four-times higher than that of the IrO$_2$ film 6 formed at about 400° C. It is also apparent that the IrO$_2$ films formed at about 450° C. and about 500° C. have approximately the same XRD chart. Accordingly, it can be seen from the charts in FIGS. 3A to 3C that the crystallinity of the IrO$_2$ film 6 is varied at a film formation temperature between about 400° C. and about 450° C. so that IrO$_2$(200) is dominantly aligned. The crystallinity of the IrO$_2$ film 6 is not varied at the film formation temperature of about 450° C. or higher.

As shown in FIG. 4, for the film formation temperature up to about 450° C., the resistivity ρ of the resultant IrO$_2$ film 6 is reduced with the increase in the film formation temperature, while being kept at a low, substantially constant value for the temperature higher than about 450° C.

From the foregoing, the temperature for forming the IrO$_2$ film 6 is preferably set to be equal to or higher than about 450° C.

Moreover, it has been experimentally confirmed that at the atmospheric temperature of about 700° C. or higher, the Ir film 4 is oxidized at the heated substrate surface by oxygen which is introduced into the chamber upon forming the IrO$_2$ film 6, whereby a dense IrO$_2$ aggregate is formed. In order to avoid such a problem, the temperature for forming the IrO$_2$ film 6 must be about 700° C. or less.

Furthermore, in order to examine the anti-oxidation properties of the IrO$_2$ film 6, the IrO$_2$/Ir/TaSiN multilayered electrodes (including the IrO$_2$ film 6) formed at various temperatures were annealed in oxygen to determine the presence/absence of hillocks. For the IrO$_2$ film 6 formed at about 400° C. or less, hillocks were produced when the IrO$_2$ film 6 was annealed in oxygen at about 600° C. or higher, whereby sufficient anti-heat properties and anti-oxidation properties were not obtained. However, for the IrO$_2$ film 6 formed at about 450° C. or higher, no hillocks were produced even when the IrO$_2$ film 6 was annealed in oxygen at a temperature up to about 800° C.

From these results, it has been confirmed that the temperature for forming the IrO$_2$ film 6 is advantageously set to about 450° C. or higher.

Thereafter, by using the spin-on method, the SBT film 7 (Sr/Bi/Ta=8/24/20) serving as the ferroelectric film 7 is formed on the lower electrode 8 formed as described above.

More specifically, constituent elements of the SBT film 7 are dispersed in a solvent to prepare a precursor solution. The precursor solution thus prepared is applied on the lower electrode 8 using a spinner operated at a rotational speed of about 3000 rpm. Then, the resultant substrate is dried in the atmosphere at about 150° C. for about 10 minutes, pre-baked in the atmosphere at about 400° C. for about 30 minutes, and thereafter, crystallized at about 700° C. for about one hour. These steps are repeated three times to form the SBT film 7 having a thickness of about 2000 Å. After the SBT film 7 was formed, hillocks or the like were not recognized in the lower electrode 8, and through analysis of their cross section by the SEM and the Auger electron spectroscopy, it was confirmed that no reaction occurs between the lower electrode 8 and the SBT film 7.

It should be noted that similar effects can be obtained even by using a HfSiN film instead of the TaSiN film as the diffusion barrier film 3.

Moreover, even when a Pt film having a thickness of about 500 Å is formed on the lower electrode 8 to complete the lower electrode structure, and the SBT film 7 is similarly formed on the lower electrode structure thus completed, neither hillocks nor the reaction between the lower electrode 8 and the SBT film 7 is observed. In this structure, a leakage current is also reduced by about one digit. More specifically, the leakage current is about $1.2 \times 10^{-6}$ A/cm$^2$ in the SBT/IrO$_2$ (including IrO$_2$ serving as the initial film 5)/Ir/TaSiN structure, while being about $9.8 \times 10^{-8}$ A/cm$^2$ in the SBT/Pt/IrO$_2$ (including the IrO$_2$ initial film 5)/Ir/TaSiN structure.

It should be noted that similar effects can be obtained even by providing a thin film of Ir, Ru, Rh, Os, Re or alloy thereof (e.g., Pt-Rh) as an underlying film of the SBT film 7, instead of the Pt film.

As described above, in the lower electrode 8 including an electrically conductive oxide film such as IrO$_2$, the initial film 5 is first formed on the Ir film 4, and the IrO$_2$ film 6 is then formed thereon, whereby the IrO$_2$ film 6 can be formed at a high temperature of about 450° C. or higher. Thus, the crystallinity of the IrO$_2$ film 6 is improved to prevent oxygen from passing through the IrO$_2$ film 6. Therefore, The TaSiN film 3 is not oxidized in a high-temperature oxygen atmosphere.

Thus, according to the present invention, the ferroelectric film 7 can be formed in a high-temperature oxygen atmosphere, whereby the lower electrode 8 having sufficient barrier properties required for realizing high-density FRAMs can be formed.

Hereinafter, the result of examining the respective thicknesses of the Ir film 4 and the IrO$_2$ film 6 which constitute the lower electrode 8 of the present invention will be discussed.

For examination, some samples were produced in a manner similar to the above-mentioned process as follows.

First, the thermal oxide film 2 having a thickness of about 6000 Å is formed on the silicon substrate 1, and the TaSiN film 3 is formed thereon. Thereafter, the lower electrode 8 having an IrO$_2$/Ir structure is formed thereon by the DC magnetron sputtering method. The IrO$_2$/Ir structure is formed by first forming the Ir film 4 and then forming the IrO$_2$ film 6 thereon. More specifically, the Ir film 4 is first formed with a thickness of about 1000 Å at a DC power of about 0.5 kW; a substrate temperature of about 500° C.; and a gas pressure of about 0.6 Pa. Only Ar gas is used as a sputtering gas. Then, the initial film 5 of IrO$_2$ for forming the IrO$_2$ film 6 at about 500° C. is formed on the Ir film 4. More specifically, the initial film 5 is formed with a thickness of about 200 Å at a DC power of about 1 kW, a substrate temperature of about 350° C., a gas pressure of about 0.71 Pa, and a flow rate ratio of sputtering gases (an Ar flow rate/an O$_2$ flow rate) of 1/9. Subsequently, the IrO$_2$ film 6 is formed at about 500° C. on the initial film 5. More specifically, the IrO$_2$ film 6 is formed at a DC power of about 1 kW, a gas pressure of about 0.71 Pa, and a flow rate ratio of sputtering gases (an Ar flow rate/an O$_2$ flow rate) of 1/9. Under these conditions, the thickness of the IrO$_2$ film 6 was varied in the range of about 500 Å to about 1800 Å.

The relation between the thickness and the anti-heat properties of the IrO$_2$ film 6 is evaluated according to the presence/absence of hillocks which result from annealing in oxygen. It should be noted that "the thickness of the $IrO_2$ film 6" as used in the following description is intended to include the thickness of the initial film 5 if the initial film 5 formed from the $IrO_2$ film is present between the Ir film 4 and the $IrO_2$ film 6.

From the evaluation result, it was confirmed that hillocks are not produced in the $IrO_2$/Ir/TaSiN multilayered electrode when $1 \leq$ (a thickness of the $IrO_2$ film 6)/(a thickness of the Ir film 4) $\leq 3$.

When $1 >$ (a thickness of the $IrO_2$ film 6)/(a thickness of the Ir film 4), the $IrO_2$ film 6 does not have the oxygen barrier properties, thereby allowing oxygen to pass therethrough. Accordingly, Ir is segregated on the $IrO_2$ film 6 to form single crystalline $IrO_2$, resulting in a rough surface of the $IrO_2$ film 6. Moreover, when $3 <$ (a thickness of the $IrO_2$ film 6)/(a thickness of the Ir film 4), the $IrO_2$ film 6 is thick, whereby a strong stress is generated in the transverse direction during the high-temperature process, producing small cracks. Oxygen is introduced through the cracks onto the Ir film 4. Moreover, since the thickness of the Ir film 4 in this condition does not provide sufficient resistance to oxygen, whereby the oxygen thus introduced reaches the TaSiN film 3. Accordingly, expansion of the TaSiN film 3 due to oxidation occurs, resulting in peeling between Ir and TaSiN.

When $1 \leq$ (a thickness of the $IrO_2$ film 6)/(a thickness of the Ir film 4), the $IrO_2$ film 6 has sufficient anti-oxygen properties to prevent oxygen from passing therethrough. Therefore, such peeling does not occur. Moreover, when (a thickness of the $IrO_2$ film 6)/(a thickness of the Ir film 4) $\leq 3$, stress is alleviated, whereby hillocks are not produced.

It should be noted that in the exemplary structure described above with reference to FIG. 1, the thickness of the Ir film 6 is about 1000 Å, and the total thickness of the initial film 5 and the $IrO_2$ film 6 is about 1500 Å. Therefore, (a thickness of the $IrO_2$ film 6)/(a thickness of the Ir film 4)=1.5.

From the above result, generation of hillocks can be suppressed by controlling the respective thicknesses of the Ir film 4 and the $IrO_2$ film 6 which constitute the lower electrode 8, thereby making it possible to form the electrode 8 having an excellent anti-heat (lower) electrode 8 for realizing high-density FRAMs.

Hereinafter, the result of examining the effects of the composition of the TaSiN film 3 serving as the diffusion barrier film upon its anti-heat properties and anti-oxidation properties will be discussed.

For examination, some samples were produced in a manner similar to the above-mentioned process as follows.

More specifically, the thermal oxide film 2 having a thickness of about 6000 Å is first formed on the silicon substrate 1, and the TaSiN film 3 having the same composition as described above is formed thereon. Subsequently, by the DC magnetron sputtering method, the Ir film 4 having a thickness of about 1000 Å is formed thereon at a DC power of about 0.5 kW, a substrate temperature of about 500° C., and a gas pressure of about 0.6 Pa. Only Ar gas is used as a sputtering gas. Then, the SBT film 7 is formed on the Ir film 4 by the spin-on method. In forming the SBT film 7, the baking step for crystallization is repeated three times, each being at about 700° C. for about 1 hour, so that the baking process is conducted for about 3 hours in total.

After the SBT film 7 was formed by the above-mentioned method, no hillocks as well as no reaction between the SBT film 7 and other films was recognized by the SEM observation of their cross section. Moreover, as a result of the analysis by the Auger electron spectroscopy, a region having a thickness of about 100 Å in which the constituent elements are diffused with each other was observed at the interface between the SBT film 7 and the Ir film (electrode) 4, and oxygen diffusion with the thickness of about 300 Å in the Ir film 4 was also observed.

The $IrO_2$ film 6 included in the structure of FIG. 1 is not formed on the Ir film 4 in the above examination. Also in this case, oxygen does not pass through the Ir film 4. The principle thereof can be explained as follows.

Upon forming the SBT film 7, the surface of the Ir film 4 is oxidized, whereby an $IrO_2$ film having a thickness of about 100 Å to about 300 Å is formed. At the same time, an oxide film such as SBT or the like is formed on the Ir film 4. For example, in the spin-on method, this oxidation at the surface of the Ir film 4 is conducted by oxygen contained in a solution. The oxide film thus formed has the same effects and oxygen barrier properties as those of another $IrO_2$ film 6 which is formed on the Ir film 4.

Accordingly, the lower electrode having the oxygen barrier properties can be formed even without conducting the step of forming the $IrO_2$ film 6 on the Ir film 4.

By setting the composition of the $Ta_xSi_{1-x}N_y$ film 3 serving as the diffusion barrier film to $0.75 < x < 0.95$ and $0.3 < y < 0.5$, the $Ta_xSi_{1-x}N_y$ film 3 having excellent oxygen barrier properties can be formed by the high-temperature process of about 600° C. or higher.

Similar effects can be obtained even when the ferroelectric film 7 is formed by the sputtering method or MOCVD method instead of the spin-on method. Moreover, the respective thicknesses of the Ir film 4 and the TaSiN film 3 are not limited to the specific values described above, as long as the reaction does not occur at a desired temperature. Similar effects can be also obtained even when a HfSiN film instead of the TaSiN film is used as the diffusion barrier film 3. Furthermore, similar effects can be obtained even when a Pt, Ru or Os film instead of the Ir film is used as the electrode film 4 formed on the TaSiN film or HfSiN film serving as the diffusion film 3.

Thus, by setting the composition of the diffusion barrier film 3 to the above-mentioned range, the anti-heat properties and anti-oxidation properties thereof are improved, whereby the TaSiN film 3 is completely prevented from being oxidized in a high-temperature oxygen atmosphere. Therefore, the ferroelectric film 7 can be formed in a high-temperature oxygen atmosphere, making it possible to form the electrode structure having sufficient oxygen barrier properties required to implement high-density FRAMs.

Hereinafter, a production process of the semiconductor memory device incorporating the ferroelectric capacitor will be described with reference to FIGS. 5 and 6, wherein the semiconductor memory device includes the lower electrode 8 which uses an oxide conductor having such a structure as described above.

First, the LOCOS oxide film 9 having a thickness of about 5000 Å is formed at the surface of the substrate 1 to form an element isolation region. Then, the selection transistor including the gate electrode 10, the source/drain regions 11 and the like is formed, and the first silicon oxide film 12 having a thickness of about 5000 Å is formed as an interlayer insulation film by a CVD (Chemical Vapor Deposition) method. Thereafter, a contact hole having a diameter of about 0.5 $\mu$m is formed therein. The contact hole is then filled with polysilicon by the CVD method, and a surface of the filled region is planarized, whereby the polysilicon plug 13 is formed.

Then, as described above, the amorphous TaSiN film 3 serving as the diffusion barrier film is formed with a thickness of about 1000 Å on the polysilicon plug 13 by the DC magnetron sputtering method. The resultant substrate is subjected to heat-treatment in a nitrogen atmosphere so as to stabilize the TaSiN film 3. This heat-treatment may be omitted depending upon the conditions for forming the TaSiN film 3.

The amorphous TaSiN film 3 of Example 1 is formed by using an alloy target of Ta/Si=10/3 at a substrate temperature of about 500° C.; a sputtering power of about 2000 W; a sputtering gas pressure of about 0.7 Pa; and a flow rate ratio of sputtering gases (i.e., an Ar flow rate/a $N_2$ flow rate) of 3/2. Moreover, the amorphous TaSiN film 3 of Example 1 is subjected to heat-treatment at about 600° C. for about one hour in a pure nitrogen atmosphere at a temperature rising rate of about 5° C./min. The TaSiN film 3 formed under the aforementioned conditions was confirmed to have an amorphous structure by X-ray diffraction spectroscopy, and to have a composition of $Ta_{0.85}Si_{0.15}N_{0.4}$ according to the analysis by the Auger electron spectroscopy.

Thereafter, the lower electrode 8 is formed on the TaSiN film 3 by the DC magnetron sputtering method. The lower electrode 8 has a multi-layer electrode structure employing an oxide dielectric material.

More specifically, the Ir film 4 is first formed with a thickness of about 1000 Å at a DC power of about 0.5 kW; a substrate temperature of about 500° C.; and a gas pressure of about 0.6 Pa. Only Ar gas is used as a sputtering gas. Thereafter, an $IrO_2$ film is formed on the Ir film 4 as an initial film for forming the $IrO_2$ film 6 at about 500° C. (not shown in FIG. 5; see FIG. 1). This $IrO_2$ film as the initial film is formed with a thickness of about 200 Å at a DC power of about 1 kW; a substrate temperature of about 350° C.; a gas pressure of about 0.71 Pa; and a flow rate ratio of sputtering gases (an Ar flow rate/an $O_2$ flow rate) of 1/9. Then, the $IrO_2$ film 6 is formed on the initial film. More specifically, the $IrO_2$ film 6 is formed with a thickness of about 1300 Å at a DC power of about 1 kW; a gas pressure of about 0.71 Pa; and a flow rate ratio of sputtering gases (an Ar flow rate/an $O_2$ flow rate) of 1/9.

The lower electrode 8 is constituted as a layered structure of the Ir film 4 and the $IrO_2$ film 6 (the $IrO_2$ film 6 includes the initial film if formed). As described above, a leakage current can further be reduced by additionally forming a Pt film having a thickness of about 500 Å on the $IrO_2$ film 6.

Thereafter, the ferroelectric film 7 is formed on the lower electrode 8 by the process previously described. Then, the upper electrode 18 having a thickness of about 500 Å is formed on the ferroelectric film 7 by the DC magnetron sputtering method. The ferroelectric film 7 is patterned by a dry etching method using Ar and $C_2F_6$, whereas the upper electrode 18 is patterned by a dry etching method using $Cl_2$, both the ferroelectric film 7 and the upper electrode 18 being patterned into a prescribed shape of, for example, a square of about 2.6 μm by 2.6 μm. Then, the lower electrode 8 having the aforementioned layered structure is patterned into a prescribed shape by a dry etching method using, for example, $Cl_2$ and $C_2F_6$, whereas the TaSiN film 3 is patterned into a prescribed shape by a dry etching method using $C_2F_6$.

Thereafter, the second silicon oxide film 19 is formed as an interlayer insulation film by the CVD method, and contact holes are formed at respective prescribed positions through the second silicon oxide film 19. Then, by the DC magnetron sputtering method, the aluminum extended electrode 20 from the upper electrode 18 of the ferroelectric capacitor and the aluminum extended electrode 21 from the selection transistor are respectively formed in the contact holes thus formed, whereby the semiconductor memory device as shown in FIG. 5 is formed.

The semiconductor memory device of FIG. 5 produced according to the aforementioned process exhibits a hysteresis loop as shown in FIG. 6 when a triangular wave voltage is applied between the aluminum extended electrode 20 from the upper electrode 18 of the capacitor including the ferroelectric film and the aluminum extended electrode 21 from the silicon substrate 1 (from the selection transistor). The applied triangular wave voltage has such an intensity as to form an electric field having an intensity of about 150 kV/cm between the upper electrode 18 and the lower electrode 8. A frequency of the applied voltage is about 75 Hz. It can be seen from FIG. 6 that sufficient ferroelectric characteristics as the ferroelectric capacitor have been achieved. Moreover, the hysteresis loop maintains its symmetry, showing that sufficiently excellent contact has been established between the silicon substrate 1 and the $Ir/IrO_2$ lower electrode 8. This means that there is no reaction between the Ir film 4 included in the lower electrode 8 and the underlying polysilicon plug 13, and that there is no reaction between the diffusion barrier film 3 and the $Ir/IrO_2$ lower electrode 8.

Furthermore, no reaction between the films were recognized through observation of the cross-sectional structure by an electron microscope as well as analysis by the Auger electron spectroscopy.

In addition to a process for applying a film, such as an MOD method, other methods including a vacuum deposition method, a DC magnetron sputtering method and an MOCVD method may be used to form the ferroelectric film 7. Moreover, although the SBT film is shown to be used as the ferroelectric film 7, sufficient anti-oxidation properties can also be obtained by using other ferroelectric materials including $SrBi_2Nb_2O_9$, $Bi_4Ti_3O_{12}$, $BaBi_2Nb_2O_9$, $BaBi_2Ta_2O_9$, $PbBi_2Ta_2O_9$, $SrBi_4Ti_4O_{15}$, $SrBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Sr_2Bi_4Ti_4O_{18}$, $Ba_2Bi_4Ti_5O_{18}$ and $Pb_2Bi_4Ti_5O_{18}$, or high dielectric materials including $(Ba_xSr_{1-x})TaO_3$ and $SrBi_4Ti_4O_{15}$ as the ferroelectric film 7.

Although the contact plug 13 is shown to be formed from polysilicon, similar effects can be obtained even when the contact plug 13 is formed from materials other than polysilicon (e.g., tungsten).

As specifically described above, according to the structure of the semiconductor memory device of the present invention, the diffusion barrier film 3 has an amorphous structure, and therefore, does not have any grain boundaries. As a result, the diffusion barrier film 3 has significant barrier properties against oxygen, platinum, bismuth or the like. Moreover, in forming the lower electrode 8 having the layered structure of $Ir/IrO_2$, the $IrO_2$ film 6 is formed by a high-temperature process after the initial film 5 is formed on the Ir film 4. Therefore, oxygen can be completely prevented from passing through the $IrO_2$ film 6 even during the sintering process in a high-temperature oxygen atmosphere. Accordingly, the upper surface of the plug 13 formed from polysilicon, tungsten or the like, which is located under the lower electrode 8, is not oxidized, whereby excellent contact between the plug 13 and the lower electrode 8 is maintained.

By achieving such an electrode structure capable of enduring high-temperature annealing, the semiconductor memory device having excellent characteristics can be obtained.

Moreover, by forming the lower electrode 8 additionally including an electrically conductive film containing at least one of the metal elements selected from the group consisting of Pt, Ir, Ru, Rh, Os and Re on the layered structure of Ir/IrO$_2$, a leakage current can further be reduced.

By setting the composition of the diffusion barrier film 3 to Ta$_x$Si$_{1-x}$N$_y$ or Hf$_x$Si$_{1-x}$N$_y$ (where 0.75<x<0.95 and 0.3<y<0.5), the oxygen barrier properties can further be improved.

Furthermore, by setting the thickness ratio of IrO$_2$ film 6 to the Ir film 4 to 1≦(a thickness of the IrO$_2$ film 6)/(a thickness of the Ir film 4)<3, generation of hillocks can be suppressed.

Moreover, by setting the temperature for forming the IrO$_2$ film 6 included in the layered structure of the lower electrode 8 to the range of about 450° C. to about 700° C., the resistivity of the IrO$_2$ film 6 to be formed can be reduced, as well as the formation of a dense IrO$_2$ aggregate resulting from oxidation of the underlying Ir film 4 during formation of the IrO$_2$ film 6 can be suppressed.

Furthermore, by conducting the steps of forming the dielectric film 7 from a material including oxygen and forming the upper electrode 18 on the dielectric film 7, after the step of forming the Ir film 4 on the diffusion barrier film 3, the lower electrode 8 having oxygen barrier properties can be obtained without separately conducting the step of forming the IrO$_2$ film 6. As a result, the number of process steps can be reduced.

Furthermore, by using, as the initial film 5, an IrO$_2$ film which can be formed by a target of the same material as that used for forming the IrO$_2$ film 6, film characteristics can be improved as well as the process can be simplified.

The following Examples relate to a method for forming a ferroelectric capacitor which can be incorporated in the semiconductor memory device as described above as Example 1, and a method for producing a non-volatile semiconductor memory device incorporating this ferroelectric capacitor, and in particular, relate to a process of annealing a ferroelectric film included in a capacitor portion.

The substrate to be used in the semiconductor memory device incorporating the ferroelectric capacitor according to the present invention is not limited to a specific material, as long as the substrate can be used for normal semiconductor devices, integrated circuits or the like. For example, the substrate may be selected from a semiconductor substrate (e.g., silicon), a compound semiconductor substrate (e.g., GaAs), an oxide crystalline substrate (e.g., MgO) or a glass substrate, according to the types, applications or the like of the device to be formed. However, a silicon substrate is desirable.

In the following description, the ferroelectric film may be formed from a Bismuth-layer-structured-family compound such as Bi$_4$Ti$_3$O$_{12}$, SrBi$_2$Ta$_2$O$_9$, SrBi$_2$Nb$_2$O$_9$, SrBi$_2$(Ta$_{1-x}$Nb$_x$)$_2$O$_9$, BaBi$_2$Nb$_2$O$_9$, BaBi$_2$Ta$_2$O$_9$, PbBi$_2$Nb$_2$O$_9$, PbBi$_2$Ta$_2$O$_9$, PbBi$_4$Ti$_4$O$_{15}$, SrBi$_4$Ti$_4$O$_{15}$, BaBi$_4$Ti$_4$O$_{15}$, Sr$_2$Bi$_4$Ti$_5$O$_{18}$, Ba$_2$Bi$_4$Ti$_5$O$_{18}$, Pb$_2$Bi$_4$Ti$_5$O$_{18}$, Na$_{0.5}$Bi$_{4.5}$Ti$_4$O$_{15}$, K$_{0.5}$Bi$_{4.5}$Ti$_4$O$_{15}$ or the like, wherein SrBi$_2$Ta$_2$O$_9$ and SrBi$_2$(Ta$_{1-x}$Nb$_x$)$_2$O$_9$ (where 0<x≦1) are preferable.

The ferroelectric film is formed on the above-mentioned substrate by any of the known methods in the art including: the methods for applying a film such a sol-gel method and an MOD method; an MOCVD method; or a sputtering method.

In the film application method, a raw-material solution is prepared by mixing (i) an organic solvent including a salt of a part of the constituent elements of the ferroelectric film, metal alkoxide or the like, with (ii) an organic solvent including a salt of the remaining elements, metal alkoxide or the like. Then, by using a spin-coating method or the like, the raw-material solution thus prepared is applied with a thickness of about 20 nm to about 100 nm per one application. Thereafter, the drying step is conducted at about 100° C. to about 300° C.

Hereinafter, one exemplary method for preparing a raw-material solution for use in the MOD method will be described.

Tantalum ethoxide (Ta(OC$_2$H$_5$)$_5$), bismuth 2-ethylhexanoate (Bi(OCOC$_7$H$_{15}$)$_2$) and strontium 2-ethylhexanoate (Sr(OCOC$_7$H$_{15}$)$_2$) are used as starting raw-materials for preparing the solution. First, tantalum ethoxide is weighed to be dissolved in 2-Ethylhexanoic acid. Then, in order to facilitate the reaction, the resultant solution is heated to about 100° C. to the maximum temperature of about 120° C. for 30 minutes with stirring. Then, ethanol and water resulting from the aforementioned reaction at about 120° C. are removed. Strontium 2-ethylhexanoate dissolved in about 20 ml to about 30 ml of xylene is added at an appropriate amount to the resultant solution so as to achieve Sr/Ta=8/20. Then, the solution is heated to about 125° C. to the maximum temperature of about 140° C. for 30 minutes with stirring. Thereafter, bismuth 2-ethylhexanoate dissolved in about 10 ml of xylene is added at an appropriate amount to the resultant solution so as to obtain Sr/Bi/Ta=8/24/20. Then, the solution is heated to about 130° C. to the maximum temperature of about 150° C. for about 10 hours with stirring.

The resultant solution is then distilled at about 130° C. to about 150° C. for about 5 hours in order to remove alcohol having a low molecular weight, water, and xylene used as a solvent. Thereafter, the solution is adjusted to have a SrBi$_2$Ta$_2$O$_9$ concentration of about 0.1 mol/l. The solution thus prepared is used as a precursor solution.

It should be noted that the starting raw-materials are not limited to the above-mentioned materials as long as they are organic metals containing oxygen. Moreover, the solvent is not limited to the above-mentioned solvent as long as the starting materials are sufficiently dissolved therein.

According to the conventional method for applying a film, all of the subsequent processes including pre-baking at about 500° C. to about 600° C.; a heat-treatment at about 650° C. to about 800° C. for crystallizing the ferroelectric film; a formation of the upper electrode; a subsequent heat-treatment at about 500° C. to about 700° C. for suppressing a leakage current across the film in the post-process, are conducted in an oxidizing atmosphere.

On the other hand, in the following Examples of the present invention, heat-treatment for crystallization which requires heat-treatment at the highest temperature (hereinafter, such heat-treatment is also referred to as "crystallizing heat-treatment") is conducted in an inert atmosphere such as nitrogen or argon.

Figure 25:
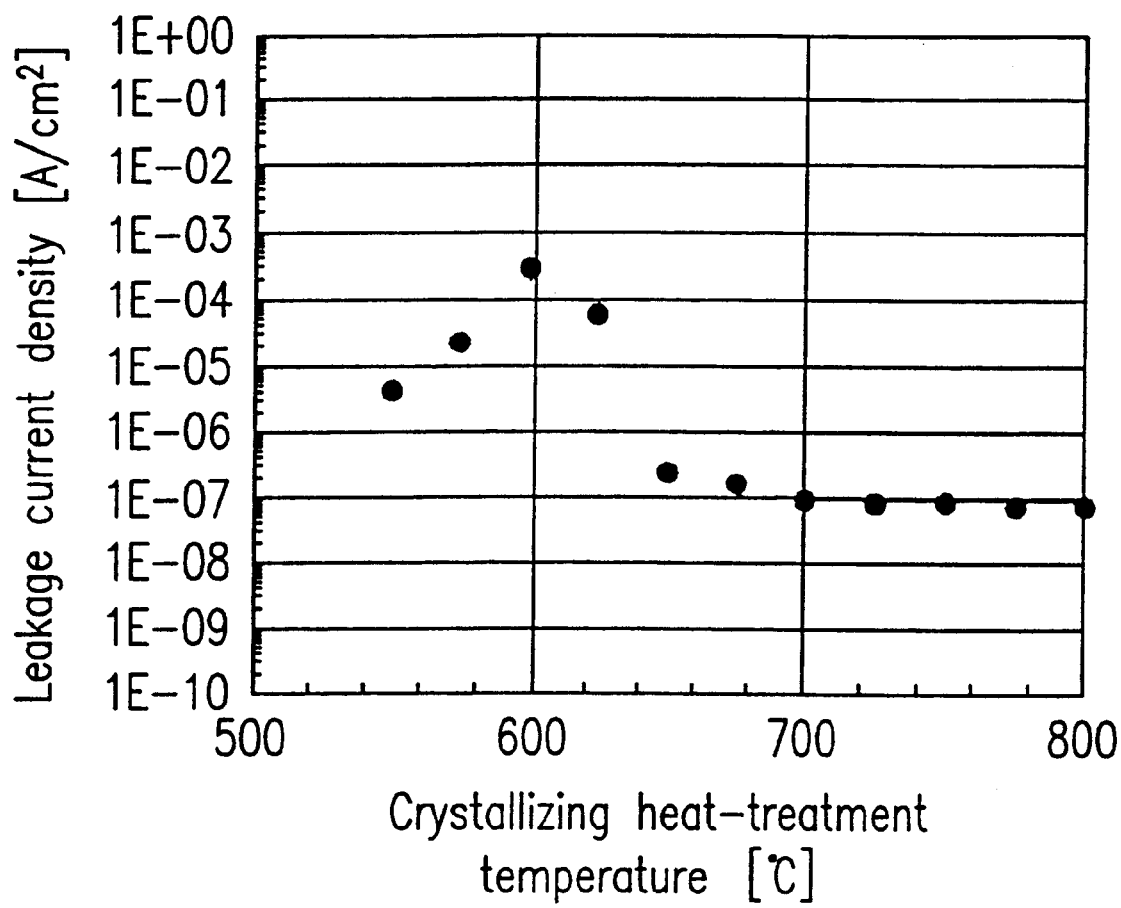
FIG. 25 is a diagram showing the relation between a heat-treatment temperature for crystallizing a ferroelectric film and a leakage current density.

This crystallizing heat-treatment in the inert atmosphere is preferably conducted in the temperature range of about 650° C. to about 800° C., in view of the relation between crystallizing heat-treatment temperature and leakage current density as shown in FIG. 25. It should be noted that FIG. 25 shows the data which was obtained by the present inventors in the course leading to the present invention. Specifically, FIG. 25 shows the data obtained from the samples prepared by applying an MOD solution on a four-layered substrate of Pt/TiO$_2$/SiO$_2$/Si; annealing the resultant substrate in a nitrogen atmosphere for about 60 minutes for crystallizing the film(s) at one time; forming the upper electrode; and conducting heat-treatment in an oxygen atmosphere at about 550° C. for about 60 minutes.

The crystallizing heat-treatment may be conducted either as batch-crystallization for collectively heat-treating the film deposited to a desired thickness by repeating the applying and drying steps several times, or as a crystallization process for heat-treating the films on a film-by-film basis after every applying and drying step. Moreover, the time for the heat-treatment is not specifically limited. The heat-treatment may be conducted for several minutes to several hours in a diffusion furnace, or may be conducted for several tens of seconds to several minutes by RTA (Rapid Thermal Annealing). In short, the time for the heat-treatment is determined so that sufficient crystallization can be achieved in respective heat-treatment processes.

In general, heat-treatment for crystallizing an oxide must be conducted in an oxygen atmosphere due to its requirement to supply a sufficient amount of oxygen. On the other hand, in the methods such as a sol-gel method and an MOD method, a large amount of oxygen is contained in the raw materials such as metal alkoxide and salt. Therefore, crystallization can be conducted even in an inert atmosphere such as nitrogen or argon. However, in order to improve the ferroelectric characteristics and suppress a leakage current, it is preferable to conduct heat-treatment at about 400° C. to about 650° C. after the formation of the upper electrode.

According to the MOCVD method, the ferroelectric film is formed as follows: a film is deposited in an oxygen-containing atmosphere at a relatively low substrate temperature of about 650° C., whereby an amorphous or insufficiently-crystallized film is obtained. The deposition conditions including types of a source material, a carrier gas flow rate, an oxygen concentration and a pressure are determined so that a sufficient amount of oxygen can be introduced into the film to result in sufficient crystallization by the post-annealing process. The post-annealing process is then conducted in an inert atmosphere such as nitrogen or argon at about 650° C. to about 800° C., thereby crystallizing the ferroelectric film. Such film deposition and post-annealing process may be conducted either by collectively performing the post-annealing process for the film deposited to a desired thickness, or by repeating the film deposition and the post-annealing process several times until a desired film thickness is obtained. In either case, the upper electrode is formed after the post-annealing process, and heat-treatment is then conducted at about 400° C. to about 650° C. in order to suppress a leakage current as well as supplement the oxygen loss.

According to the sputtering method, the ferroelectric film is formed as in the case of the MOCVD method as follows: a film is deposited in an oxygen-containing atmosphere at a relatively low substrate temperature of about 650° C., whereby an amorphous or insufficiently-crystallized film is obtained. The deposition conditions including types of a source material, a carrier gas flow rate, an oxygen concentration and a pressure are determined so that a sufficient amount of oxygen can be introduced into the film to allow sufficient crystallization by the post-annealing process. Also in this case, the post-annealing process is conducted thereafter in an inert atmosphere such as nitrogen or argon at about 650° C. to about 800° C., thereby crystallizing the ferroelectric film. Such film deposition and post-annealing process may be conducted either by collectively performing the post-annealing process for the film deposited to a desired thickness, or by repeating the film deposition and the post-annealing process several times until a desired thickness is obtained. In either case, the upper electrode is formed after the post-annealing process, and heat-treatment is then conducted at about 400° C. to about 650° C. in order to suppress a leakage current as well as supplement the oxygen loss.

By using the above-mentioned methods, the heat-treatment for crystallizing the ferroelectric film, which generally requires the highest temperature, can be conducted in an inert atmosphere such as nitrogen or argon, whereby damages to the stacked-type ferroelectric memory device due to oxidation in a high-temperature process can be sufficiently suppressed.

Hereinafter, some examples regarding a process for heat-treating the ferroelectric film according to the present invention will be described with reference to the accompanying drawings.

EXAMPLE 2

A process of producing a ferroelectric memory device according to Example 2 of the present invention will now be described with reference to FIGS. 7 and 8A to 8D.

Figure 8A:
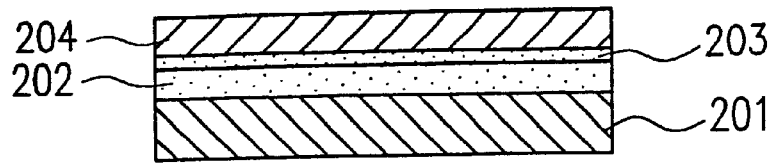
FIGS. 8A to 8D are schematic cross sectional views illustrating the steps of the production process of Example 2.
Figure 8B:
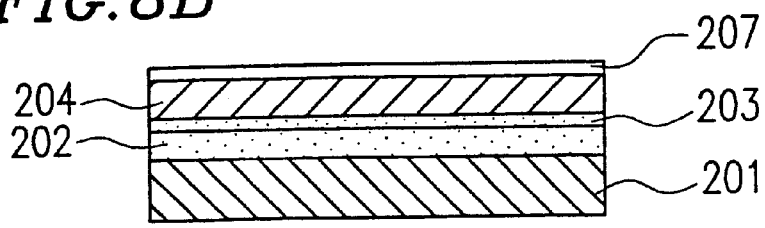

First, a thermal oxide film ($SiO_2$ film) 202 having a thickness of about 200 nm is formed on a silicon substrate 201 by heat-treatment in an oxygen atmosphere containing vapor at about 1050° C. for about 20 minutes. Then, a Ti film having a thickness of about 20 nm is formed on the thermal oxide film 202 by sputtering Ti at a DC power of about 2 kW and a substrate temperature of about 400° C. A closely contacting $TiO_2$ film 203 having a thickness of about 40 nm is formed by thermally oxidizing the Ti film. Thereafter, a lower Pt electrode 204 having a thickness of about 200 nm is formed by sputtering Pt at a DC power of about 2 kW and a substrate temperature of about 500° C. Thus, a $Pt/TiO_2/SiO_2/Si$ substrate as shown in FIG. 8A is prepared.

Then, an MOD solution of ferroelectric material $SrBi_2Ta_2O_9$ (Sr/Bi/Ta=8/24/20) produced by the above-mentioned method for producing the raw-material solution is applied on the $Pt/TiO_2/SiO_2/Si$ substrate by a spin-coating method at a rotational speed of about 3000 rpm so that each layer has a thickness of about 50 nm (Step 251). The resultant substrate is dried in air at 250° C. for about 5 minutes (Step 252). Thereafter, the substrate is pre-baked in a normal-pressure oxygen atmosphere at a substrate temperature of about 500° C. for about 30 minutes (Step 253) so as to decompose a residual organic compound in the film. Then, heat-treatment is conducted in a normal-pressure nitrogen atmosphere at about 700° C. for about 60 minutes (Step 254), thereby crystallizing a $SrBi_2Ta_2O_9$ film 207 (See FIG. 8B).

Figure 8C:
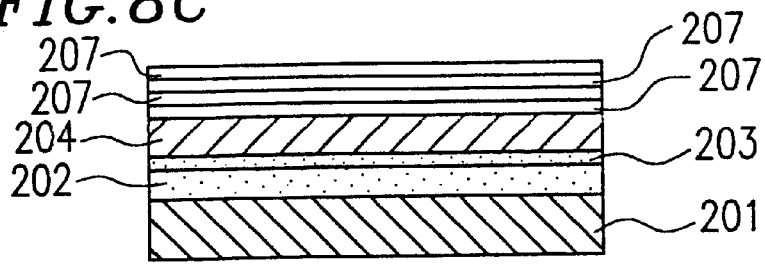

The series of Steps 251 to 254 is repeated four times to form the $SrBi_2Ta_2O_9$ film 207 having a total thickness of about 200 nm (See FIG. 8C).

Figure 8D:
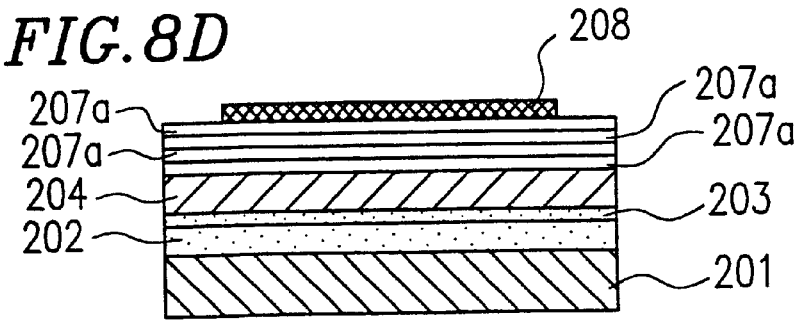

In the following Step 255, Pt is deposited on the $SrBi_2Ta_2O_9$ film 207 by a sputtering method at a DC power of about 2 kW and a substrate temperature of about 500° C. Then, the Pt thus deposited is patterned by a known dry etching method into a prescribed shape, whereby an upper Pt electrode 208 as shown in FIG. 8D is obtained. More specifically, the upper Pt electrode 208 is formed with an area of about $1 \times 10^{-4}$ cm$^2$. The dry etching method is conducted by using an ECR (Electron Cyclotron Resonance) etcher and a mixture gas of $C_2F_6$, $CHF_3$ and $Cl_2$.

Thereafter, in order to suppress a leakage current, heat-treatment is conducted in a normal-pressure nitrogen atmosphere at a substrate temperature of about 550° C. for about 60 minutes (Step 256). It should be noted that reference numeral 207a in FIG. 8D denotes the $SrBi_2Ta_2O_9$ film after the annealing process conducted in an oxygen atmosphere in Step 256.

Thus, the ferroelectric capacitor of the present example is formed.

Figure 9:
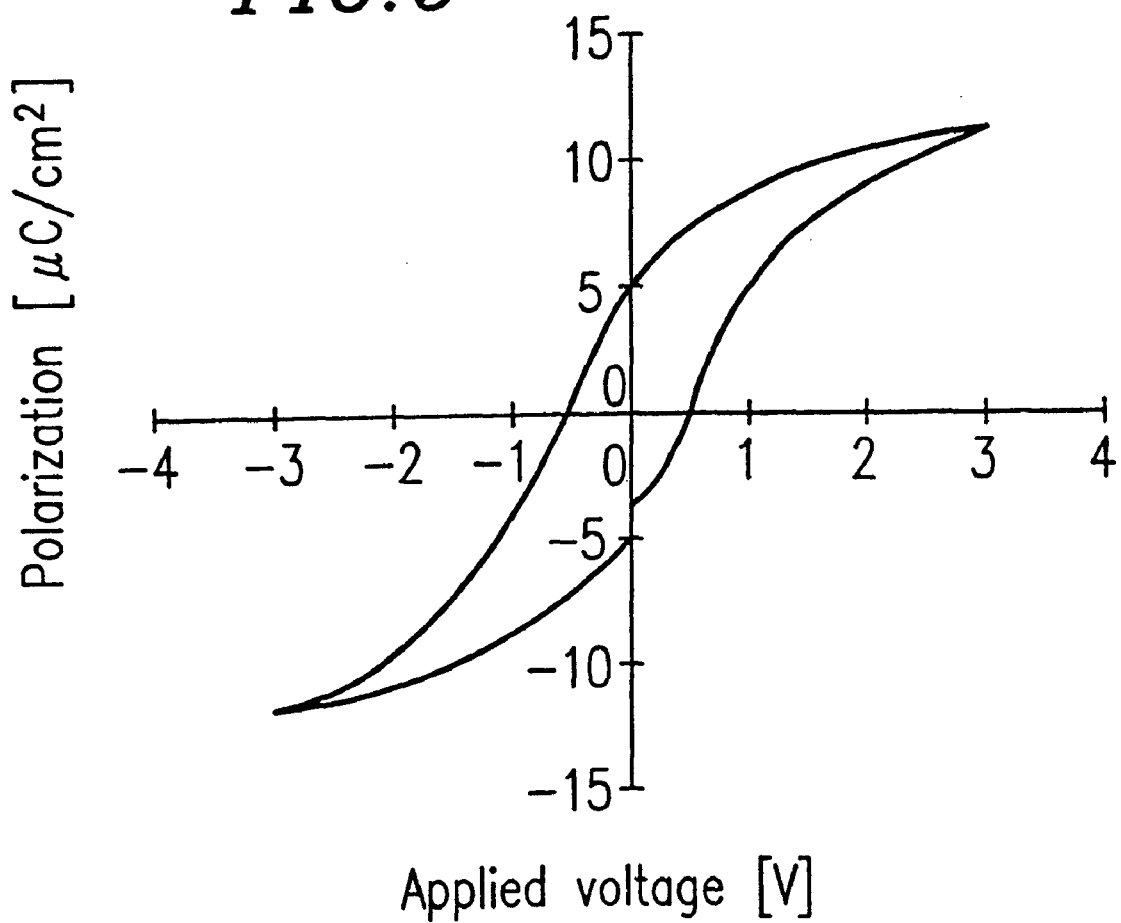
FIG. 9 is a diagram showing hysteresis characteristics of the ferroelectric capacitor produced by the production process of Example 2.
Figure 10:
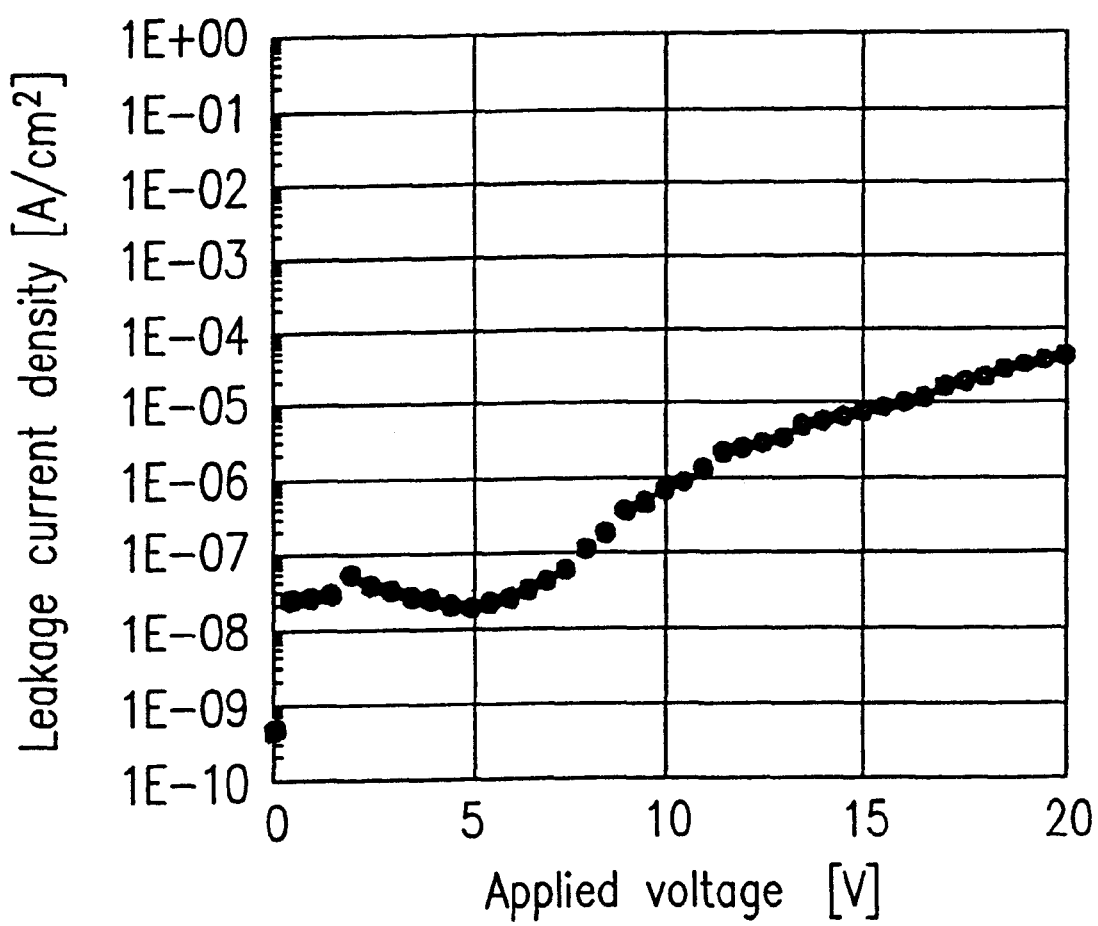
FIG. 10 is a diagram showing leakage current characteristics of the ferroelectric capacitor produced by the production process of Example 2.

FIGS. 9 and 10 show the hysteresis characteristics (with an applied voltage: ±3 V) and leakage-current characteristics of the ferroelectric capacitor formed as described above, respectively. It can be seen from these figures that a residual polarization Pr=4.9 $\mu C/cm^2$ and a coercive voltage Vc=0.48 V (or a coercive electric field Ec=24 kV/cm) are obtained as ferroelectric characteristics, and that a leakage current density is about $3 \times 10^{-8}$ $A/cm^2$ as well as a breakdown voltage is 20 V or more when a voltage of +3 V is applied. Thus, the ferroelectric capacitor obtained according to the present example has excellent values regarding any of ferroelectric characteristics, a leakage current density and a breakdown voltage.

Although an inert atmosphere used in the heat-treatment for crystallizing the ferroelectric film 207 (Step 254) is shown to be a nitrogen atmosphere, similar effects can be obtained even when an argon atmosphere is used instead.

Moreover, the $SrBi_2Ta_2O_9$ film is shown to be used as the ferroelectric film 207. However, when $SrBi_2(Ta_{1-x}Nb_x)_2O_9$ (x=0.4) resulting from partially replacing the Ta in $SrBi_2Ta_2O_9$ with Nb is used instead, a residual polarization Pr=6 $\mu C/cm^2$ and a coercive voltage Vc=0.72 V (or a coercive electric field Ec=35 kV/cm) can be obtained. In addition, a leakage current density is about $8 \times 10^{-8}$ $A/cm^2$ as well as a breakdown voltage is 20 V or more when a voltage of 3 V is applied. Thus, according to the production method of the present example, excellent ferroelectric characteristics can be obtained also for $SrBi_2(Ta_{1-x}Nb_x)_2O_9$ (x=0.4). Moreover, excellent ferroelectric characteristics can be obtained even when the Nb concentration is varied in the range of $0<x \leq 1$.

EXAMPLE 3

A process of producing a ferroelectric memory device according to Example 3 of the present invention will now be described with reference to FIGS. 11 and 12A to 12C.

Figure 12A:
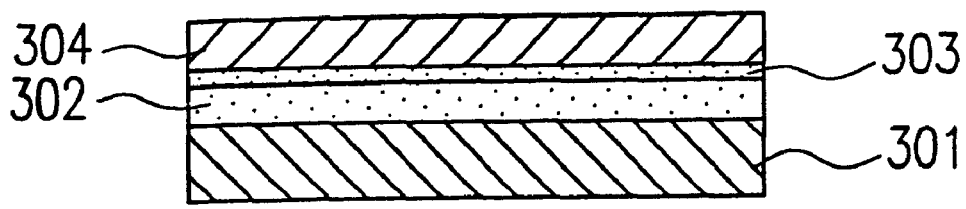
FIGS. 12A to 12C are schematic cross sectional views illustrating the steps of the production process of Example 3.
Figure 12B:
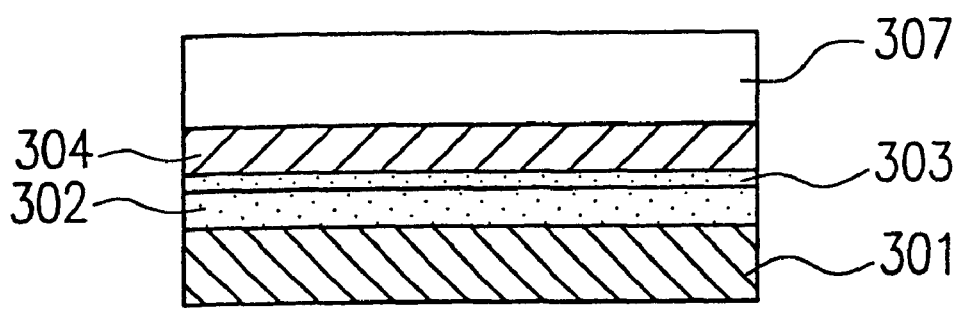

First, a thermal oxide film ($SiO_2$ film) 302 having a thickness of about 200 nm is formed on a silicon substrate 301 by heat-treatment in an oxygen atmosphere containing vapor at about 1050° C. for about 20 minutes. Then, a Ti film having a thickness of about 20 nm is formed on the thermal oxide film 302 by sputtering Ti at a DC power of about 2 kW and a substrate temperature of about 400° C. A closely contacting $TiO_2$ film 303 having a thickness of about 40 nm is formed by thermally oxidizing the Ti film. Thereafter, a lower Pt electrode 304 having a thickness of about 200 nm is formed by sputtering Pt at a DC power of about 2 kW and a substrate temperature of about 500° C. Thus, a Pt/$TiO_2$/$SiO_2$/Si substrate as shown in FIG. 12A is prepared.

Then, an MOD solution of ferroelectric material $SrBi_2Ta_2O_9$ (Sr/Bi/Ta=8/24/20) produced as in the case of Example 1 is applied on the Pt/$TiO_2$/$SiO_2$/Si substrate by a spin-coating method at a rotational speed of about 3000 rpm so that each layer has a thickness of about 50 nm (Step 351). The resultant substrate is dried in air at 250° C. for about 5 minutes (Step 352). Steps 351 and 352 are repeated four times to form the film having the total thickness of about 200 nm. Thereafter, the substrate is pre-baked in a normal-pressure oxygen atmosphere at substrate temperature of about 500° C. for about 30 minutes (Step 353) so as to decompose a residual organic compound in the film. Then, heat-treatment is conducted in a normal-pressure nitrogen atmosphere at about 700° C. for about 60 minutes (Step 354), thereby crystallizing a $SrBi_2Ta_2O_9$ film 307 (See FIG. 12B).

Figure 12C:
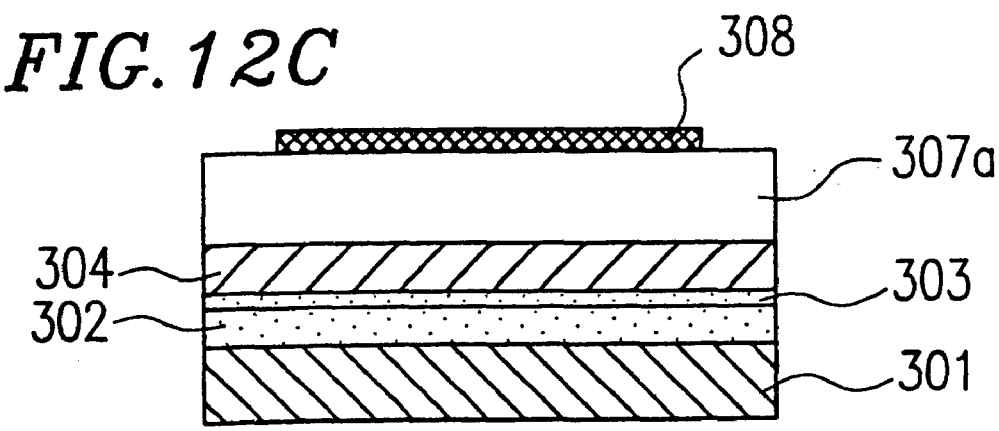

In the following Step 355, Pt is deposited on the $SrBi_2Ta_2O_9$ film 307 by a sputtering method at a DC power of about 2 kW and a substrate temperature of about 500° C. Then, the Pt thus deposited is patterned by a known dry etching method into a prescribed shape, whereby an upper Pt electrode 308 as shown in FIG. 12C is obtained. More specifically, the upper Pt electrode 308 is formed with an area of about $1 \times 10^{-4}$ $cm^2$. The dry etching method is conducted by using an ECR etcher and a mixture gas of $C_2F_6$, $CHF_3$ and $Cl_2$.

Thereafter, in order to suppress a leakage current, heat-treatment is conducted in a normal-pressure nitrogen atmosphere at a substrate temperature of about 550° C. for about 60 minutes (Step 356). It should be noted that reference numeral 307a in FIG. 12C denotes the $SrBi_2Ta_2O_9$ film after the annealing process conducted in an oxygen atmosphere in Step 356.

Thus, the ferroelectric capacitor of the present example is formed.

Figure 13:
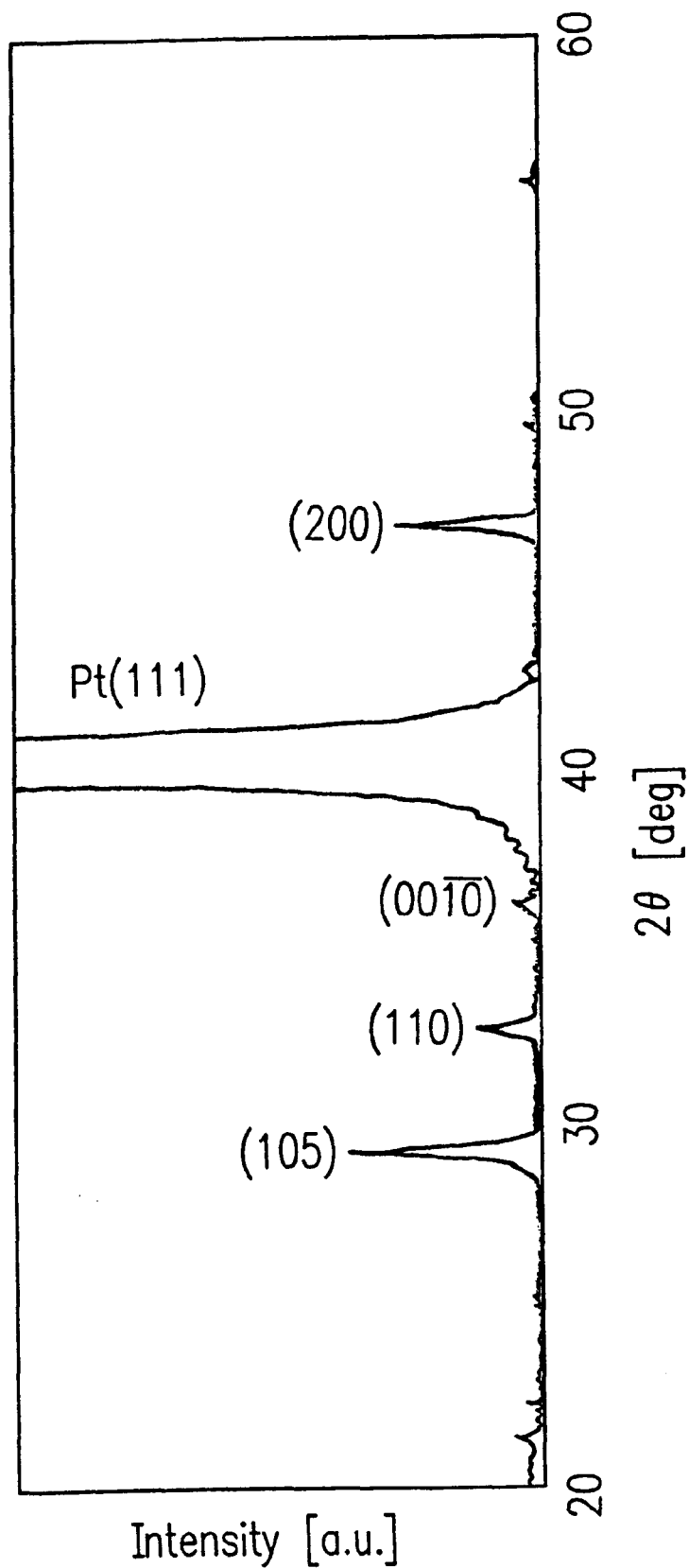
FIG. 13 is a diagram showing an XRD pattern of a ferroelectric film formed by the production process of Example 3.

FIG. 13 shows an XRD pattern of the ferroelectric film ($SrBi_2Ta_2O_9$ film) 307 formed according to the present example. It can be seen from the figure that $SrBi_2Ta_2O_9$ has been sufficiently crystallized, since intense peaks corresponding to the reflection from the (105) surface, (110) surface, (200) surface and the like are recognized.

Figure 14:
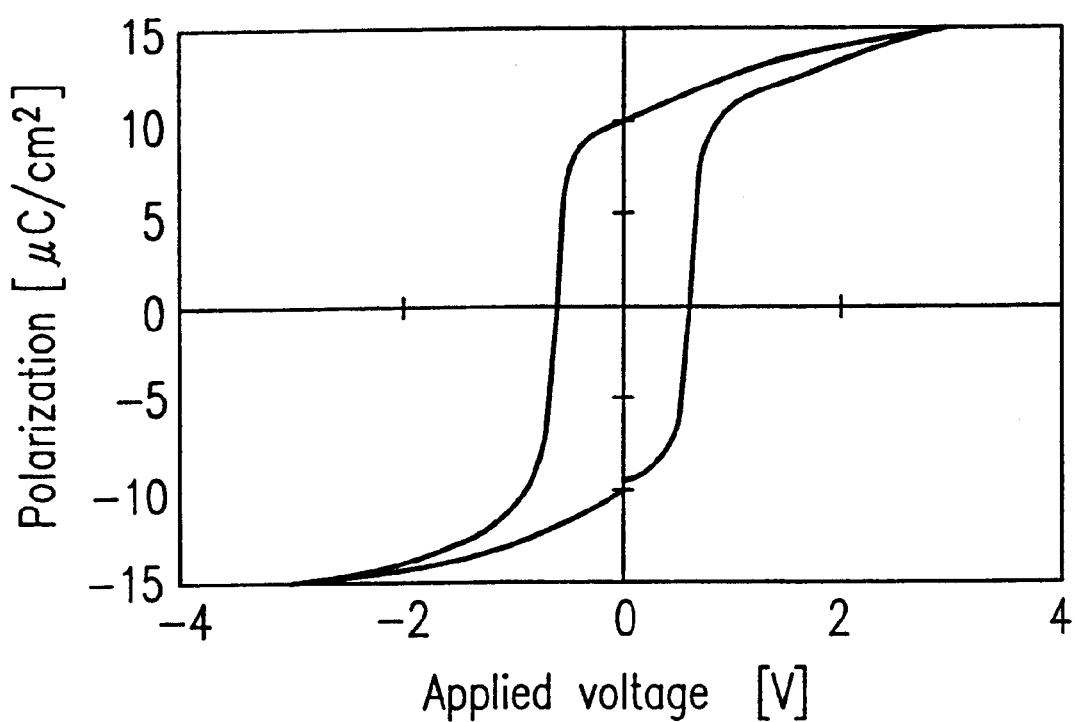
FIG. 14 is a diagram showing hysteresis characteristics of the ferroelectric capacitor produced by the production process of Example 3.
Figure 15:
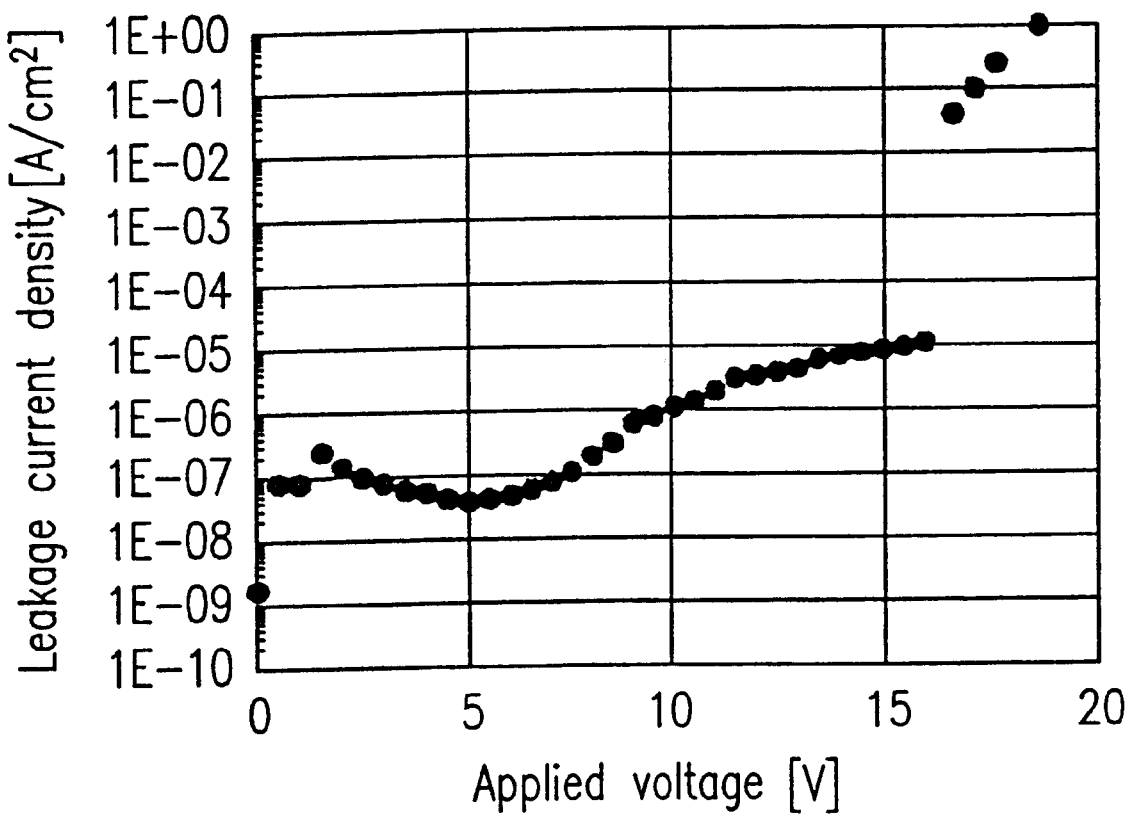
FIG. 15 is a diagram showing leakage current characteristics of the ferroelectric capacitor produced according to the production process of Example 3.
Figure 16:
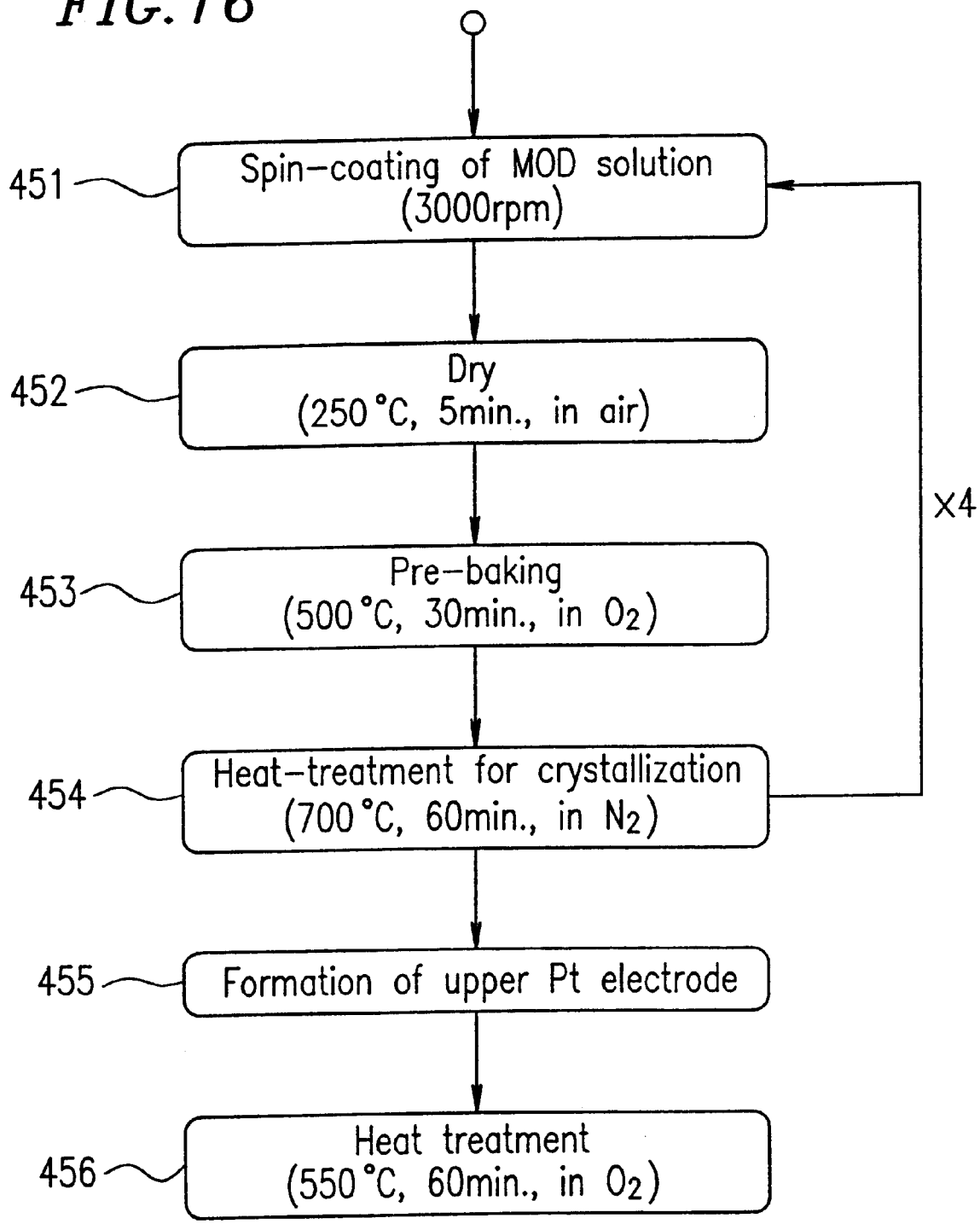
FIG. 16 is a flow chart illustrating a process for producing a ferroelectric capacitor according to Example 4 of the present invention.

FIGS. 14 and 15 show the hysteresis characteristics (with an applied voltage: ±3 V) and leakage-current characteristics of the ferroelectric capacitor formed as described above, respectively. It can be seen from these figures that a residual polarization Pr=10.2 $\mu C/cm^2$ and a coercive voltage Vc=0.68 V (or a coercive electric field Ec=34.2 kV/cm) are obtained as ferroelectric characteristics, and that a leakage current density is about $5 \times 10^{-8}$ $A/cm^2$ as well as a breakdown voltage is about 16 V when a voltage of +3 V is applied. Thus, the ferroelectric capacitor obtained according to the process of the present example has excellent values regarding any of ferroelectric characteristics, a leakage current density and a breakdown voltage.

Although an inert atmosphere used in the heat-treatment for crystallizing the ferroelectric film 307 (Step 354) is shown to be a nitrogen atmosphere, similar effects can be obtained even when an argon atmosphere is used instead.

Moreover, the $SrBi_2Ta_2O_9$ film is shown to be used as the ferroelectric film 307. However, when $SrBi_2(Ta_{1-x}Nb_x)_2O_9$ (x=0.4) resulting from partially replacing the Ta in $SrBi_2Ta_2O_9$ with Nb is used instead, a residual polarization Pr=13.5 $\mu C/cm^2$ and a coercive voltage Vc=0.84 V (or a coercive electric field Ec=41.7 kV/cm) can be obtained. In addition, a leakage current density is about $8 \times 10^{-8}$ $A/cm^2$ as well as a breakdown voltage is about 15 V when a voltage of 3 V is applied. Thus, according to the production method of the present example, excellent ferroelectric characteristics can be obtained also for $SrBi_2(Ta_{1-x}Nb_x)_2O_9$ (x=0.4). Moreover, excellent ferroelectric characteristics can be obtained even when the Nb concentration is varied in the range of $0<x \leq 1$.

EXAMPLE 4

A process of producing a ferroelectric memory device according to Example 4 of the present invention will now be described with reference to FIGS. 16 and 17A to 17D.

Figure 17A:
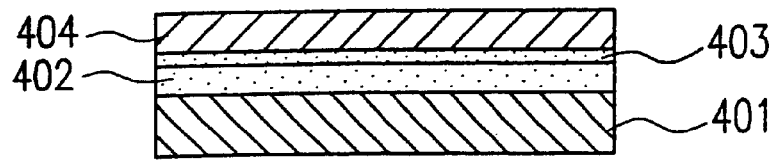
FIGS. 17A to 17D are schematic cross sectional views illustrating the steps of the production process of Example 4.
Figure 17B:
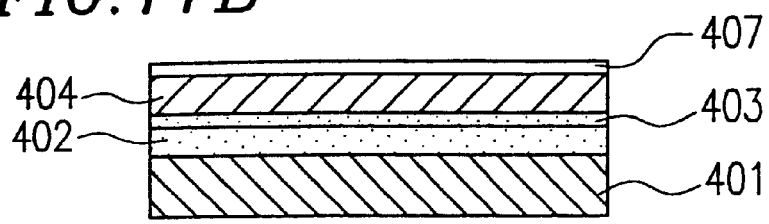

First, a Pt/$TiO_2$/$SiO_2$/Si substrate including a silicon substrate 401, a thermal oxide film ($SiO_2$ film) 402 having a thickness of about 200 nm, a closely contacting $TiO_2$ film 403 having a thickness of about 40 nm, and a lower Pt electrode 404 having a thickness of about 200 nm is prepared by the same process as in Example 2 (see FIG. 17A).

Then, an MOD solution of ferroelectric material $SrBi_2Ta_2O_9$ (Sr/Bi/Ta=8/24/20) produced as in the case of Example 1 is applied on the $Pt/TiO_2/SiO_2/Si$ substrate by a spin-coating method at a rotational speed of about 3000 rpm so that each layer has a thickness of about 50 nm (Step 451). The resultant substrate is dried in air at 250° C. for about 5 minutes (Step 452). Thereafter, the substrate is pre-baked in a normal-pressure oxygen atmosphere at a substrate temperature of about 500° C. for about 30 minutes (Step 453) so as to decompose a residual organic compound in the film. Then, heat-treatment is conducted in a normal-pressure nitrogen atmosphere at about 700° C. for about 60 minutes (Step 454), thereby crystallizing a $SrBi_2Ta_2O_9$ film 407 (See FIG. 17B).

Figure 17C:
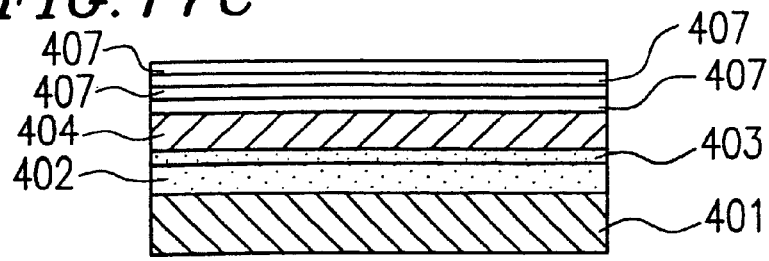
Figure 17D:
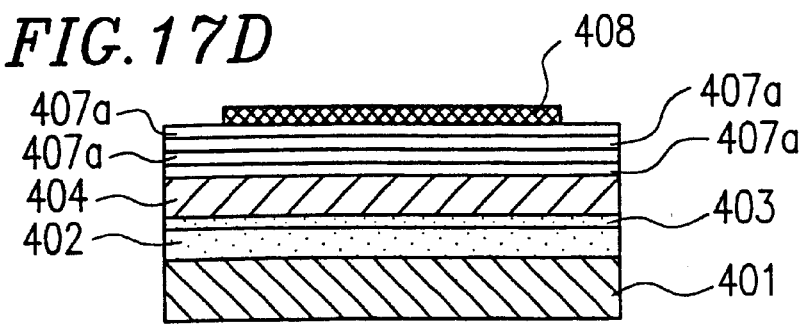

The series of Steps 451 to 454 is repeated four times to form the $SrBi_2Ta_2O_9$ film 407 having the total thickness of about 200 nm (See FIG. 17C).

In the following Step 455, Pt is deposited on the $SrBi_2Ta_2O_9$ film 407 by a sputtering method at a DC power of about 2 kW and a substrate temperature of about 500° C. Then, the Pt thus deposited is patterned by a known dry etching method into a prescribed shape, whereby an upper Pt electrode 408 as shown in FIG. 17C is obtained. More specifically, the upper Pt electrode 408 is formed with an area of about $1\times10^{-4}$ cm$^2$. The dry etching method is conducted by using an ECR etcher and a mixture gas of $C_2F_6$, $CHF_3$ and $Cl_2$.

Thereafter, in order to suppress a leakage current, heat-treatment is conducted in a normal-pressure nitrogen atmosphere at a substrate temperature of about 550° C. for about 60 minutes (Step 456). It should be noted that reference numeral 407a in FIG. 17D denotes the $SrBi_2Ta_2O_9$ film after the annealing process conducted in an oxygen atmosphere in Step 456.

Thus, the ferroelectric capacitor of the present example is formed.

Figure 18:
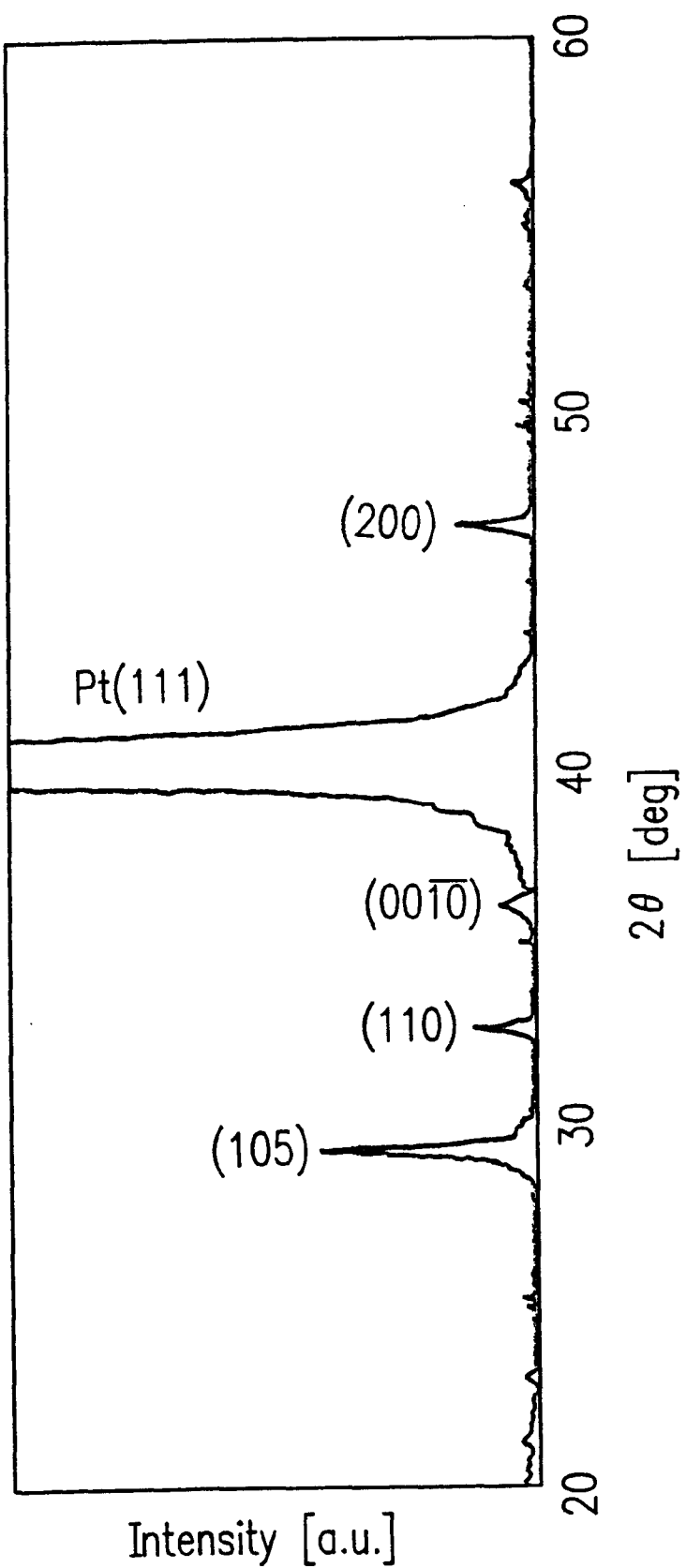
FIG. 18 is a diagram showing an XRD pattern of a ferroelectric film formed by the production process of Example 4.

FIG. 18 shows an XRD pattern of the ferroelectric film ($SrBi_2Ta_2O_9$ film) 407 formed according to the present example. It can be seen from the figure that $SrBi_2Ta_2O_9$ has been sufficiently crystallized, since intense peaks corresponding to the reflection from the (105) surface, (110) surface, (200) surface and the like are recognized.

Figure 19:
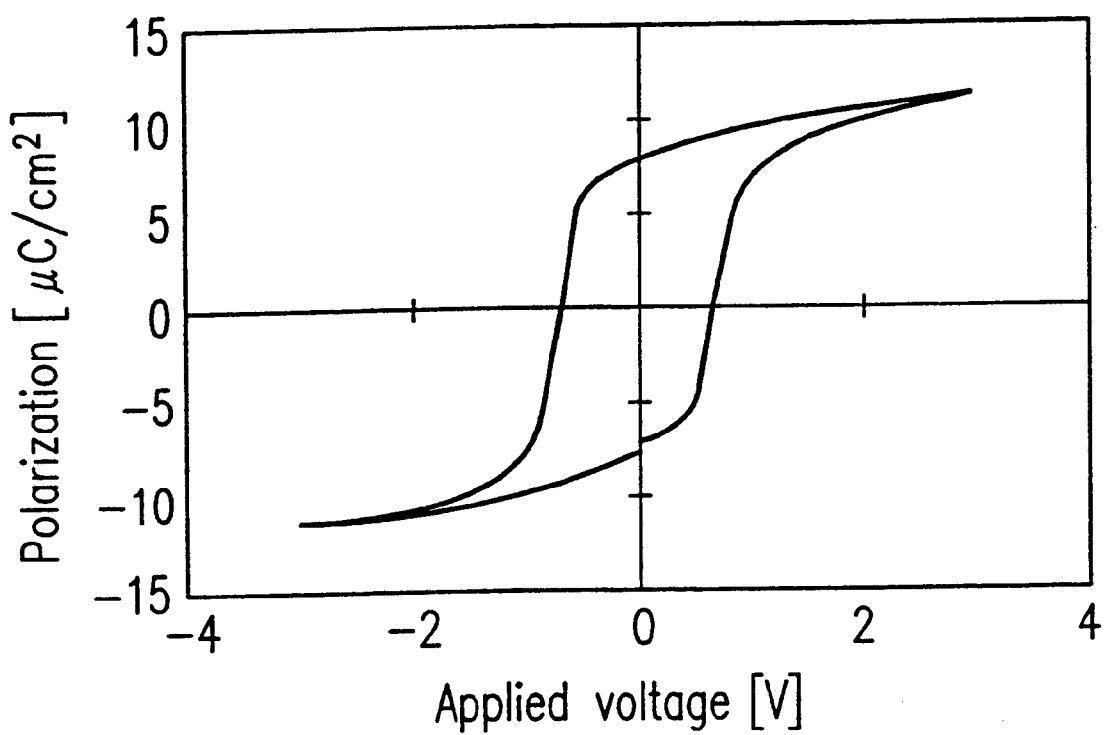
FIG. 19 is a diagram showing hysteresis characteristics of the ferroelectric capacitor produced by the production process of Example 4.
Figure 20:
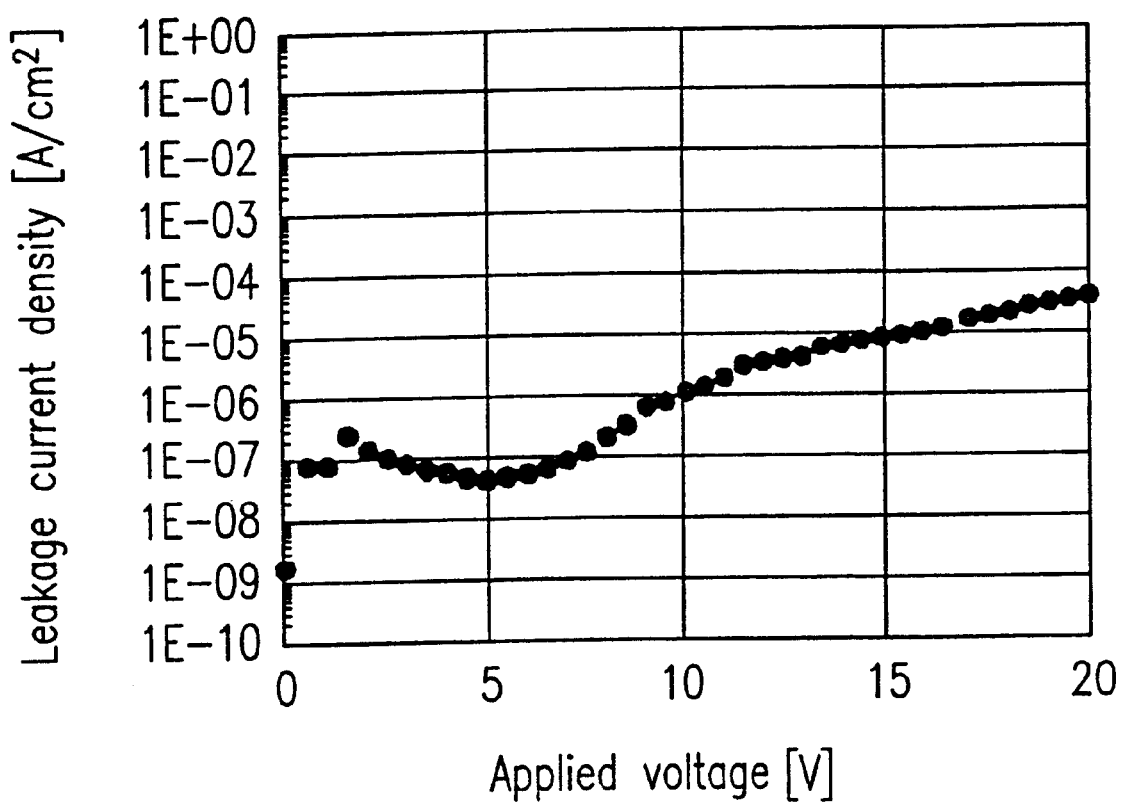
FIG. 20 is a diagram showing leakage current characteristics of the ferroelectric capacitor produced by the production process of Example 4.

FIGS. 19 and 20 show the hysteresis characteristics (with an applied voltage: ±3 V) and leakage-current characteristics of the ferroelectric capacitor formed as described above, respectively. It can be seen from these figures that a residual polarization Pr=8.6 $\mu C/cm^2$ and a coercive voltage Vc=0.69 V (or a coercive electric field Ec=34.6 kV/cm) are obtained as ferroelectric characteristics, and that a leakage current density is about $5\times10^{-8}$ A/cm$^2$ as well as a breakdown voltage is 20 V or more when a voltage of +3 V is applied. Thus, the ferroelectric capacitor obtained according to the process of the present example has excellent values regarding any of ferroelectric characteristics, a leakage current density and a breakdown voltage. In particular, a breakdown voltage is improved over Example 3.

Although an inert atmosphere used in the heat-treatment for crystallizing the ferroelectric film 407 (Step 454) is shown to be a nitrogen atmosphere, similar effects can be obtained even when an argon atmosphere is used instead.

Moreover, the $SrBi_2Ta_2O_9$ film is shown to be used as the ferroelectric film 407. However, when $SrBi_2(Ta_{1-x}Nb_x)_2O_9$ (x=0.4) resulting from partially replacing the Ta in $SrBi_2Ta_2O_9$ with Nb is used instead, a residual polarization Pr=10.2 $\mu C/cm^2$ and a coercive voltage Vc=0.85 V (or a coercive electric field Ec=42.8 kV/cm) can be obtained. In addition, a leakage current density is about $8\times10^{-8}$ A/cm$^2$ as well as a breakdown voltage is 20 V or more when a voltage of 3 V is applied. Thus, according to the production method of the present example, excellent ferroelectric characteristics can be obtained also for $SrBi_2(Ta_{1-x}Nb_x)_2O_9$ (x=0.4). Moreover, excellent ferroelectric characteristics can be obtained even when the Nb concentration is varied in the range of $0<x\leq1$.

EXAMPLE 5

A process of producing a ferroelectric memory device according to Example 5 of the present invention will now be described with reference to FIGS. 21A to 21D and 22A to 22C.

Figure 21A:
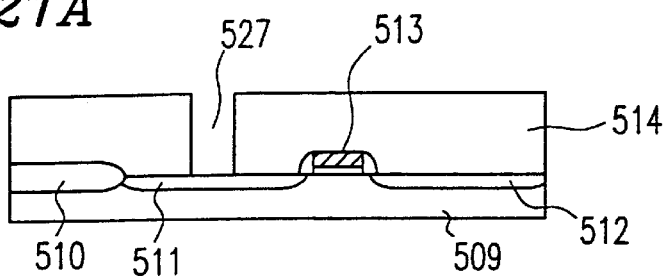
FIGS. 21A to 21D are schematic cross sectional views illustrating the first half of a process for producing a ferroelectric memory device according to Example 5 of the present invention.

First, as shown in FIG. 21A, a LOCOS oxide film 510 is formed at a surface of the silicon substrate 509 so as to form an element isolation region. Then, a switching transistor including a gate electrode 513 and impurity diffusion regions 511 and 512 each functioning as a source/drain region is formed. The gate electrode 513 is formed on the silicon substrate 509 with a gate insulation film interposed therebetween. Since the switching transistor can be formed by a known process for forming a MOSFET (Metal Oxide Semiconductor Field Effect Transistor), detailed description thereof is omitted herein. Then, an interlayer insulation film 514 is formed by a known method. Thereafter, by using a known photolithography method and a known dry etching method, a contact hole 527 is formed through the interlayer insulation film 514 at a position where the capacitor and the impurity diffusion region 511 in the substrate 509 are supposed to be in contact with each other.

Figure 21B:
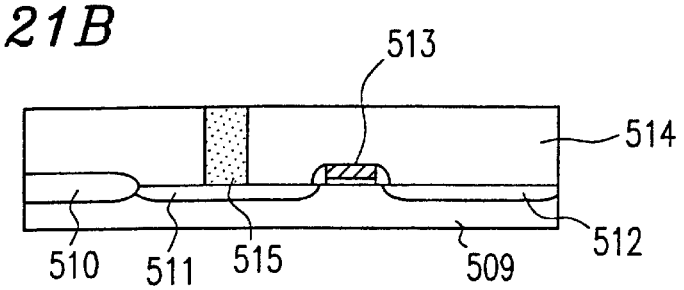

The contact hole 527 thus formed is filled with doped polysilicon, thereby forming a polysilicon plug 515. Then, the surface of the polysilicon filled in the contact hole 527 is flattened by a known CMP method, whereby the respective surfaces of the interlayer insulation film 514 and the polysilicon plug 515 are planarized, as shown in FIG. 21B.

Figure 21C:
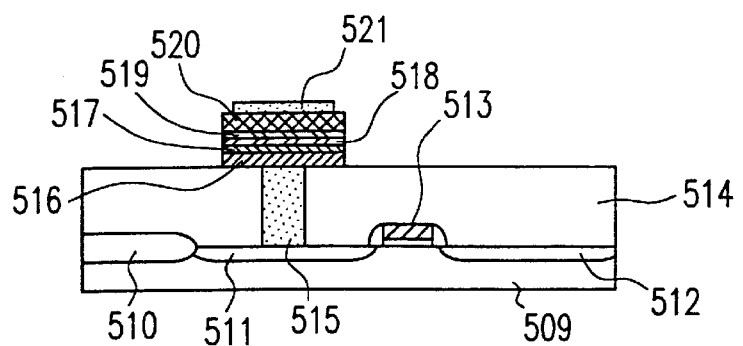

Thereafter, a TaSiN barrier metal layer (diffusion barrier layer) 516 having a thickness of about 2000 Å is deposited on the interlayer insulation film 514 by a known sputtering method. Furthermore, an Ir film 517, an $IrO_2$ film 518 and a Pt film 519 respectively having a thickness of about 500 Å, about 1000 Å and about 500 Å are sequentially formed in this order by a known sputtering method. Thus, a multi-layer lower electrode of $Pt/IrO_2/Ir/TaSiN$ as shown in FIG. 21C is formed. It should be noted that the Ir film 517 and the $IrO_2$ film 518 are provided in order to prevent the barrier metal layer 516 from being oxidized by heat-treatment in a high-temperature oxygen atmosphere.

A $SrBi_xTa_2O_9$ film 520 as a ferroelectric film is formed on the lower electrode. The $SrBi_2Ta_2O_9$ film 520 is formed by crystallizing a ferroelectric film after every step of a MOD solution application, as in the case of, for example, Example 4. More specifically, the MOD solution of ferroelectric material $SrBi_2Ta_2O_9$ (Sr/Bi/Ta=8/24/20) produced as described above is applied by a spin-coating method at a rotational speed of about 3000 rpm so that each layer has a thickness of about 50 nm. The resultant substrate is dried in air at 250° C. for about 5 minutes. Thereafter, the substrate is pre-baked in a normal-pressure oxygen atmosphere at substrate temperature of about 500° C. for about 30 minutes so as to decompose a residual organic compound in the film.

Then, heat-treatment is conducted in a normal-pressure nitrogen atmosphere at about 700° C. for about 60 minutes, thereby crystallizing the $SrBi_2Ta_2O_9$ film 520. The series of steps is repeated four times to form the $SrBi_2Ta_2O_9$ film 520 having the total thickness of about 200 nm.

Thereafter, a Pt film having a thickness of about 1000 Å is formed on the ferroelectric film 520. The Pt film thus formed is patterned into a square of about 1.7 μm by 1.7 μm using a known photolithography method and a known dry etching method, whereby an upper Pt electrode 521 is obtained. Then, in order to suppress a leakage current and supplement oxygen loss, heat-treatment is conducted in a normal-pressure oxygen atmosphere at a substrate temperature of about 550° C. for about 30 minutes, whereby ferroelectric characteristics are stabilized.

Then, by using a known photolithography method and a known dry etching method, the $SrBi_2Ta_2O_9$ film (ferroelectric film) 520, the Pt film 519, the $IrO_2$ film 518, the Ir film 517 and the TaSiN barrier metal film 516 are patterned into a square of about 2.0 μm by 2.0 μm such that the portion located directly on or above the polysilicon plug 515 remains. Thus, the shape as shown in FIG. 21C is obtained. The dry etching is conducted by using an ECR etcher, and a mixture gas of Ar, $Cl_2$ and $CF_4$ is used for the $SrBi_2Ta_2O_9$ film 520, a mixture gas of $C_2F_6$, $CHF_3$ and $Cl_2$ is used for the Pt film 519, the $IrO_2$ film 518 and the Ir film 517, and $Cl_2$ is used for the TaSiN barrier metal layer 516.

Figure 21D:
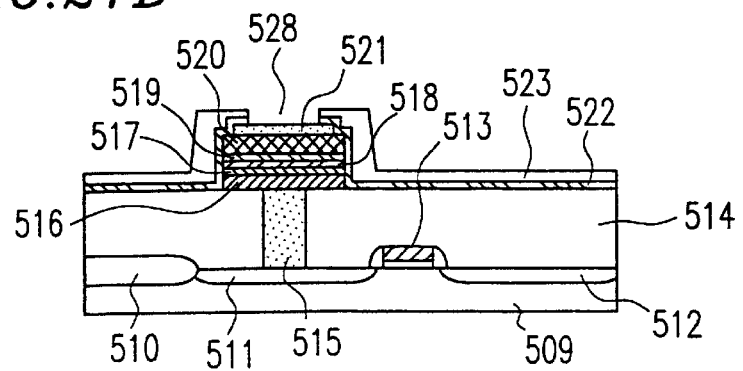

Thereafter, as shown in FIG. 21D, a $TiO_2$ barrier insulation film 522 having a thickness of about 300 Å is deposited by a known sputtering method, and a silicon oxide film 523 having a thickness of about 1500 Å is subsequently deposited thereon as an interlayer insulation film by a known CVD method. The $TiO_2$ barrier insulation film 522 and the silicon oxide film 523 are deposited so as to entirely cover the structure produced so far. Then, by using a known photolithography method and a known dry etching method, a square contact hole 528 of about 1.2 μm by 1.2 μm is formed through the $TiO_2$ barrier insulation film 522 and the silicon oxide film 523 at a position located above the $SrBi_2Ta_2O_9$ film 520 (the upper Pt electrode 521).

Figure 22A:
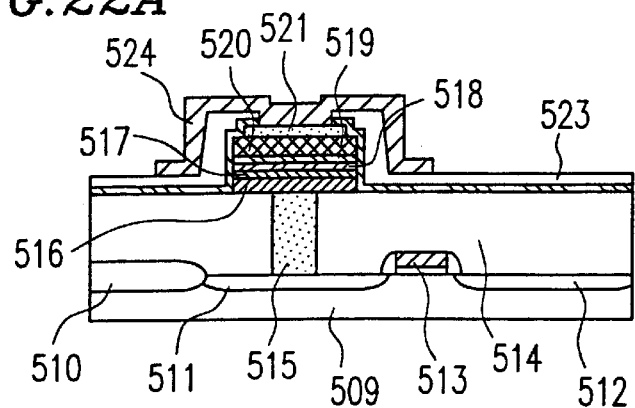
FIGS. 22A to 22C are schematic cross sectional views illustrating the latter half of the production process according to Example 5.
Figure 22B:
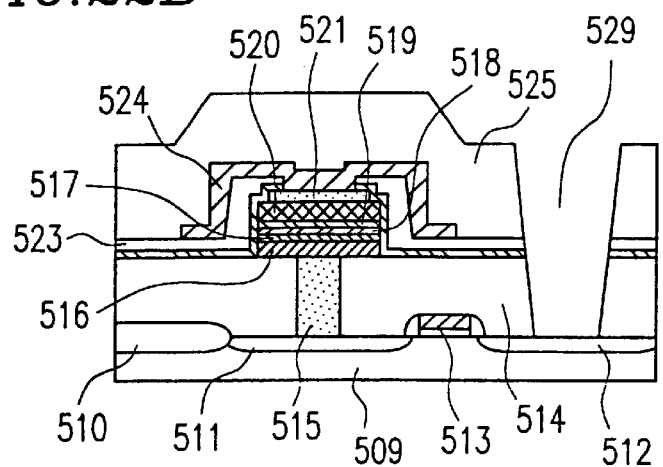
Figure 22C:
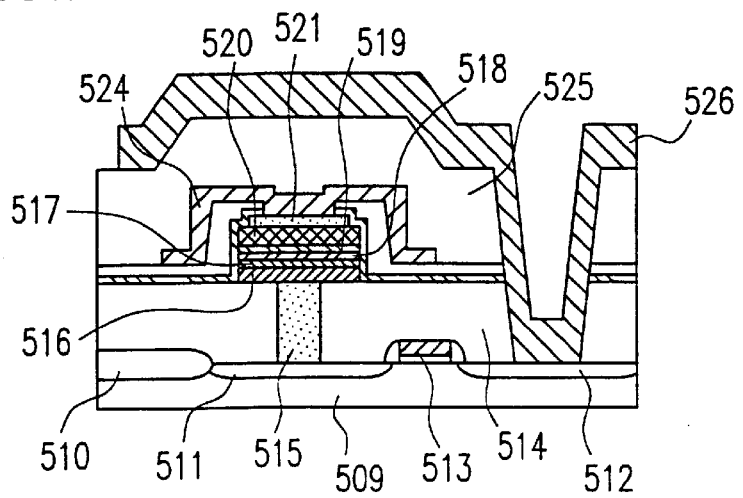

Thereafter, as shown in FIG. 22A, an Al electrode 524 having a thickness of about 4000 Å is formed. By using a known photolithography method and a known dry etching method, the Al electrode 524 thus formed is processed so as to function as a plate line. Then, heat-treatment is conducted in a normal-pressure nitrogen atmosphere at about 400° C. for about 30 minutes in order to stabilize the interface of the Al electrode 524. Subsequently, as shown in FIG. 22B, an interlayer insulation film 525 is deposited by a CVD method, and a surface thereof is planarized by a known technique. Then, a contact hole 529 reaching the other impurity diffusion layer 512 of the switching transistor is formed by a known photolithography method and a known dry etching method. Thereafter, as shown in FIG. 22C, a bit line 526 is formed by a known Al interconnection technique, whereby the ferroelectric memory device is completed.

Figure 23:
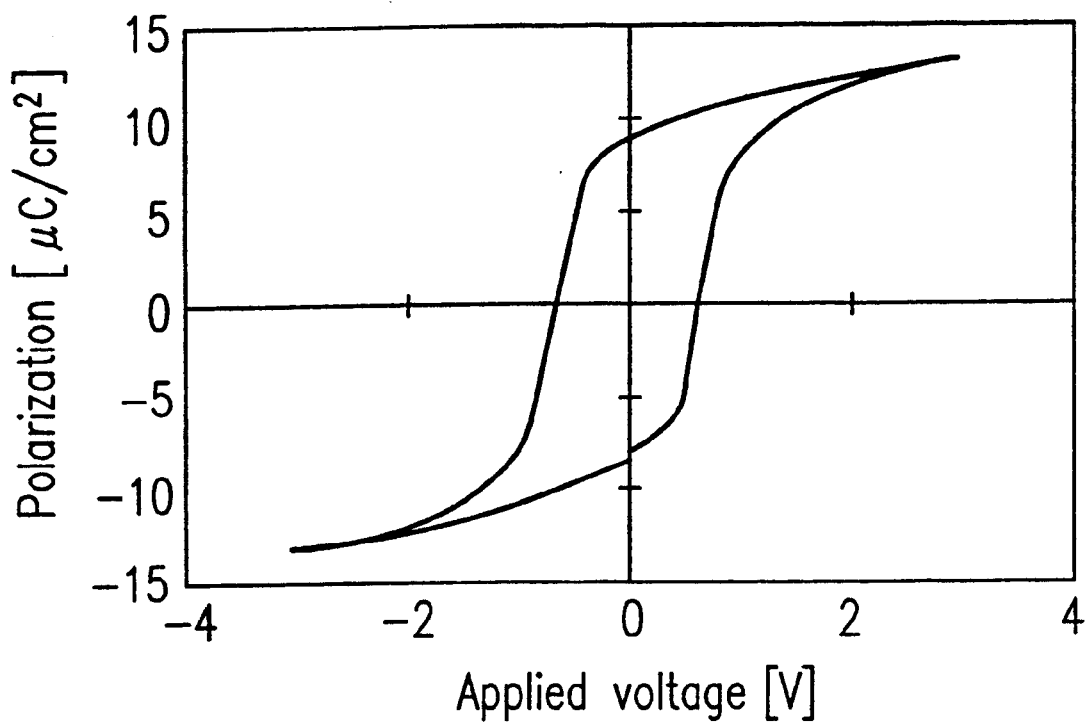
FIG. 23 is a diagram showing hysteresis characteristics of a ferroelectric capacitor incorporated in the ferroelectric memory device produced by the production process of Example 5.
Figure 24:
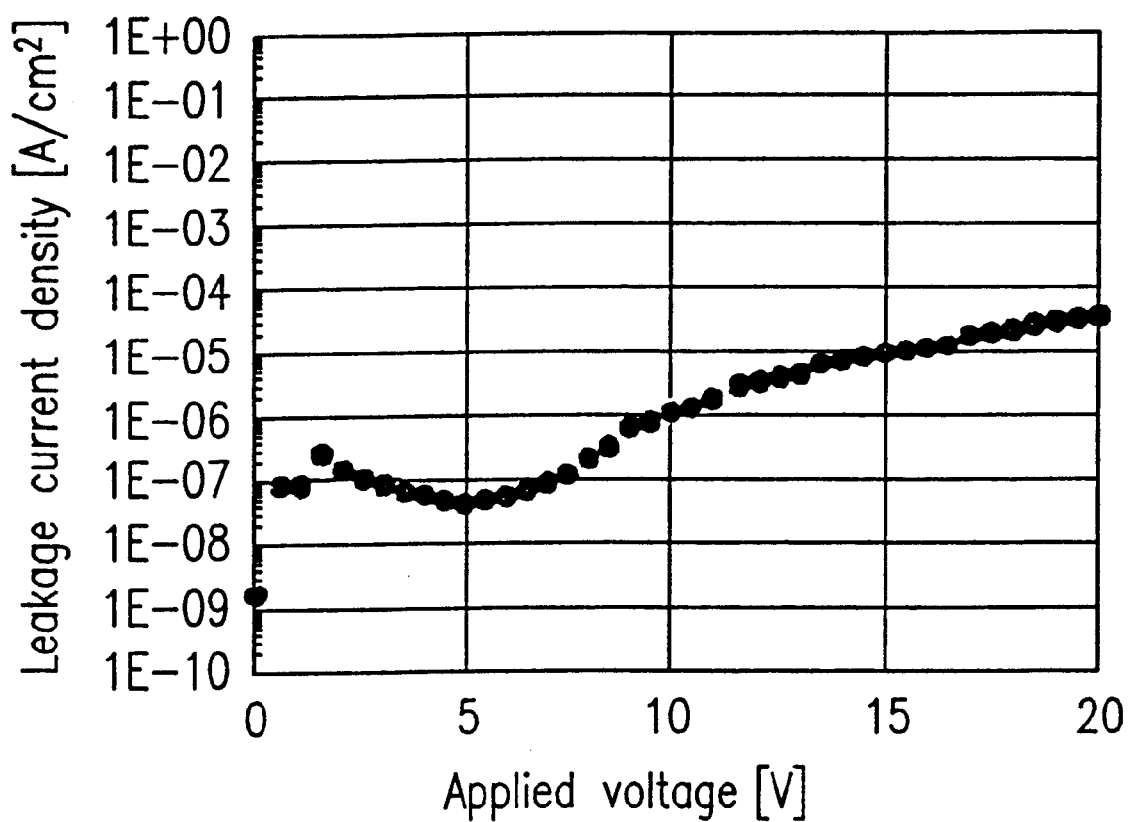
FIG. 24 is a diagram showing leakage current characteristics of the ferroelectric capacitor incorporated in the ferroelectric memory device produced by the production process of Example 5.

FIGS. 23 and 24 show the hysteresis characteristics (with an applied voltage: ±3 V) and leakage-current characteristics of the ferroelectric capacitor formed as described above, respectively. It can be seen from these figures that a residual polarization Pr=7.5 μC/cM² and a coercive electric field Ec=35.8 kV/cm are obtained as ferroelectric characteristics. Moreover, a leakage current density is about $5 \times 10^{-8}$ A/cm², and dielectric breakdown does not occur for an applied voltage of 10 V. From these results, it was confirmed that the ferroelectric capacitor incorporated in the non-volatile ferroelectric memory device thus produced exhibits sufficient operating characteristics.

Although the multi-layer lower electrode of the ferroelectric capacitor is shown to have a multi-layer is structure of Pt/$IrO_2$/Ir/TaSiN, the present invention is not limited thereto. The multi-layer lower electrode may have other multi-layer structures having excellent anti-heat properties such as Ir/$IrO_2$/Ir/TaSiN, $IrO_2$/Ir/TaSiN, Pt/$RuO_2$/Ru/TaSiN, Ru/$RuO_2$/Ru/TaSiN, $RuO_2$/Ru/TaSiN, Pt/$IrO_2$/Ir/TiN, Ir/$IrO_2$/Ir/TiN, $IrO_2$/Ir/TiN, Pt/$RuO_2$/Ru/TiN, Ru/$RuO_2$/Ru/TiN and $RuO_2$/Ru/TiN; and Ir/TaSiN, Ir/TiN, Ru/TaSiN and Ru/TiN.

Although an inert atmosphere used in the heat-treatment for crystallizing the ferroelectric film 520 is shown to be a nitrogen atmosphere, similar effects can be obtained even when an argon atmosphere is used instead.

Moreover, the $SrBi_2Ta_2O_9$ film is shown to be used as the ferroelectric film 520. However, excellent ferroelectric characteristics can similarly be obtained even when $SrBi_2(Ta_{1-x}Nb_x)_2O_9$ (0<x≦1) resulting from partially replacing the Ta in $SrBi_2Ta_2O_9$ with Nb is used instead.

In the above-mentioned production process of the ferroelectric memory device, heat-treatment in a normal-pressure oxygen atmosphere was conducted instead of the heat-treatment conducted in a normal-pressure nitrogen atmosphere at about 700° C. for about 60 minutes in order to crystallize the $SrBiTa_2O_9$ film 520. More specifically, heat-treatment was conducted in a normal-pressure oxygen atmosphere at about 650° C. for about 60 minutes. In this case, peeling occurred at various portions in the wafer surface. This peeling seems to result from the film expansion due to oxidation of TaSiN. Further study was conducted by varying the temperature of the heat-treatment in a normal-pressure oxygen atmosphere. However, the peeling occurred around the heat-treatment temperature at which the hysteresis characteristics are obtained. Therefore, the ferroelectric memory device having excellent ferroelectric characteristics was not able to be produced.

On the other hand, when the heat-treatment was conducted in a normal-pressure nitrogen atmosphere at about 650° C. for 60 minutes in order to crystallize the $SrBi_2Ta_2O_9$ film 520, such peeling did not occur. However, $SrBi_2Ta_2O_9$ was not sufficiently crystallized. Accordingly, the hysteresis characteristics were not able to be obtained as a result of measuring the ferroelectric characteristics of the produced ferroelectric memory device.

As specifically described above, according to the processes of Examples 2 to 5 of the present invention, the ferroelectric film can be crystallized without oxidizing the underlying layer of the lower electrode. Thus, a ferroelectric capacitor having excellent ferroelectric characteristics, as well as a non-volatile semiconductor memory device having a stacked-type structure incorporating such a ferroelectric capacitor can be produced with high yield.

When the heat-treatment for supplementing oxygen loss of the ferroelectric film is conducted after the crystallization step in an oxygen atmosphere at such a temperature as to prevent oxidation of the underlying layer of the lower electrode, the ferroelectric characteristics can further be improved as a result of supplementing the oxygen loss.

In the case where the ferroelectric film is formed on the lower electrode by using a method for applying a film, specifically, by repeating the steps of applying and drying a ferroelectric film material to a prescribed thickness until a desired thickness is obtained, even a thick ferroelectric film can be desirably formed.

In the case where the ferroelectric film with a desired thickness is formed on the lower electrode by repeating the step of crystallizing a ferroelectric film having a prescribed thickness by heat treatment in an inert gas atmosphere until a desired thickness is obtained, and the upper electrode is formed on the resultant ferroelectric film, morphology is improved, whereby a breakdown voltage can further be improved.

In the case where the heat-treatment for supplementing oxygen loss is conducted after the upper electrode is formed, the anneal process (heat-treatment) for supplementing oxygen loss of the ferroelectric film can also function as the anneal process (heat-treatment) for suppressing a leakage current at the interface between the ferroelectric film and the upper electrode. As a result, the ferroelectric characteristics can be improved without increasing the number of steps of the production process.

In the case where the ferroelectric film is formed from a Bismuth-layer-structured-family compound, a ferroelectric capacitor having excellent fatigue characteristics and capable of being driven at a low voltage can be obtained. In particular when the Bismuth-layer-structured-family compound is $SrBi_2(Ta_{1-x}Nb_x)_2O_9$ ($0 \leq x \leq 1$), a ferroelectric capacitor having further excellent fatigue characteristics and capable of being driven at a low voltage can be obtained.

Furthermore, in the case where the heat-treatment for crystallizing the ferroelectric film is conducted at about 650° C. to about 800° C., the ferroelectric characteristics can be improved without oxidizing the barrier metal layer (diffusion barrier layer) even when the TaSiN layer is used as the barrier metal layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a capacitor formed on a substrate and including a lower electrode, a dielectric film and an upper electrode;
   a selection transistor formed at the substrate;
   an electrically conductive plug for providing electrical connection between the selection transistor and the capacitor; and
   a diffusion barrier film provided between the electrically conductive plug and the lower electrode of the capacitor;
   wherein the diffusion barrier film comprises a $Ta_xSi_{1-x}N_y$ film or a $Hf_xSi_{1-x}N_y$ film where $0.75 \leq x \leq 0.95$, and $0.3 \leq y \leq 0.5$), and
   the lower electrode includes an Ir film and an $IrO_2$ film which are sequentially formed.

2. A semiconductor memory device according to claim 1, wherein the lower electrode further includes an electrically conductive film formed on the $IrO_2$ film, the electrically conductive film comprising at least one of metal elements selected from the group consisting of Pt, Ir, Ru, Rh, Os and Re.

3. A semiconductor memory device according to claim 1, wherein a ratio of a thickness d1 of the $IrO_2$ film to a thickness d2 of the Ir film satisfies a relation of $1 \leq d1/d2 \leq 3$.

4. A semiconductor memory device, comprising:
   a capacitor formed on a substrate and including a lower electrode, a dielectric film and an upper electrode;
   a selection transistor formed at the substrate;
   an electrically conductive plug for providing electrical connection between the selection transistor and the capacitor; and
   a diffusion barrier film provided between the electrically conductive plug and the lower electrode of the capacitor;
   wherein the diffusion barrier film is a $Ta_xSi_{1-x}N_y$ film or a $Hf_xSi_{1-x}N_y$ film (where $0.2<x<1$ and $0<y<1$),
   the lower electrode includes an Ir film and an $IrO_2$ film which are sequentially formed;
   wherein the lower electrode includes the Ir film, a thin film, and said $IrO_2$ film which are sequentially formed, and a formation temperature of the thin film is less than a formation temperature of said $IrO_2$ film.

5. The semiconductor memory device of claim 4, wherein the lower electrode further includes an electrically conductive film formed on the $IrO_2$ film, the electrically conductive film comprising at least one of metal elements selected from the group consisting of Pt, Ir, Ru, Rh, Os and Re.

6. The semiconductor memory device of claim 4, wherein the diffusion barrier film is a $Ta_xSi_{1-x}N_y$ film or a $Hf_xSi_{1-x}N_y$ film (where $0.75<x<0.95$ and $0.3<y<0.5$).

7. The semiconductor memory device of claim 4, wherein a ratio of a thickness d1 of the $IrO_2$ film to a d2 of the Ir film satisfies a relation of $1<d1/d2<3$.

* * * * *